(12) United States Patent
Matsumoto

(10) Patent No.: US 9,838,654 B2
(45) Date of Patent: Dec. 5, 2017

(54) SOLID-STATE IMAGING DEVICE, DRIVING METHOD, AND ELECTRONIC DEVICE

(71) Applicant: SONY CORPORATION, Tokyo (JP)

(72) Inventor: Shizunori Matsumoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/489,223

(22) Filed: Apr. 17, 2017

(65) Prior Publication Data

US 2017/0223317 A1    Aug. 3, 2017

Related U.S. Application Data

(63) Continuation of application No. 15/352,207, filed on Nov. 15, 2016, now Pat. No. 9,661,253, which is a continuation of application No. 14/768,534, filed as application No. PCT/JP2014/053597 on Feb. 17, 2014, now Pat. No. 9,544,519.

(30) Foreign Application Priority Data

Feb. 27, 2013 (JP) ................. 2013-037868

(51) Int. Cl.
| | |
|---|---|
| *H04N 3/14* | (2006.01) |
| *H04N 5/335* | (2011.01) |
| *H04N 9/04* | (2006.01) |
| *H04N 5/378* | (2011.01) |
| *H01L 27/146* | (2006.01) |
| *H04N 5/3745* | (2011.01) |

(Continued)

(52) U.S. Cl.
CPC ....... *H04N 9/045* (2013.01); *H01L 27/14614* (2013.01); *H01L 27/14621* (2013.01); *H01L 27/14645* (2013.01); *H04N 5/357* (2013.01); *H04N 5/3575* (2013.01); *H04N 5/3692* (2013.01); *H04N 5/378* (2013.01); *H04N 5/37455* (2013.01)

(58) Field of Classification Search
CPC ...... H04N 5/341; H04N 5/376; H04N 5/3765; H04N 5/378; H04N 5/3745; H04N 3/1575
USPC .................................. 348/294–304
See application file for complete search history.

(56) References Cited

U.S. PATENT DOCUMENTS

| | | | |
|---|---|---|---|
| 2006/0187328 A1* | 8/2006 | Lim .................... | H04N 3/1562 348/294 |
| 2007/0008206 A1* | 1/2007 | Tooyama ............ | H03M 1/0607 341/155 |

(Continued)

*Primary Examiner* — Kelly L Jerabek
(74) *Attorney, Agent, or Firm* — Sheridan Ross P.C.

(57) ABSTRACT

Provided is a solid-state imaging device including: a pixel section configured to include a plurality of pixels arranged in a matrix form, the plurality of pixels performing photoelectric conversion; column signal lines configured to transmit pixel signals output from the pixels in units of columns; an AD converting section configured to include a comparator that compares a reference signal serving as a ramp wave with the pixel signals transmitted via the column signal line and convert a reference level and a signal level of the pixel signals into digital signals independently based on a comparison result of the comparator; a switch configured to be connected with the column signal lines; and a control section configured to turn on the switch only during a certain period of time in a period of time in which the comparator is reset and cause the column signal lines to be short-circuited.

30 Claims, 22 Drawing Sheets

(51) Int. Cl.
 *H04N 5/357* (2011.01)
 *H04N 5/369* (2011.01)

(56) References Cited

U.S. PATENT DOCUMENTS

| | | | | |
|---|---|---|---|---|
| 2009/0051801 A1* | 2/2009 | Mishina | ............... | H04N 5/3742 348/311 |
| 2009/0109315 A1* | 4/2009 | Taura | ..................... | H04N 5/378 348/311 |
| 2011/0025900 A1* | 2/2011 | Kondo | ................... | H04N 5/378 348/308 |
| 2011/0234867 A1* | 9/2011 | Sato | ..................... | H04N 5/3575 348/294 |
| 2012/0307120 A1* | 12/2012 | Ito | .......................... | H04N 5/341 348/302 |
| 2016/0044267 A1* | 2/2016 | Mishina | ............... | H04N 5/3742 348/300 |

* cited by examiner

FIG. 12
AZ PERIOD OF TIME
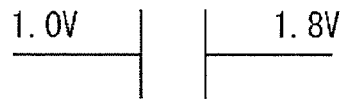
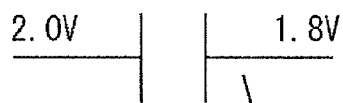
RESET LEVEL PERIOD OF TIME
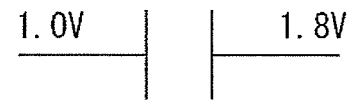
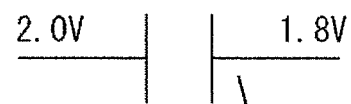 RESET LEVEL DISTRIBUTION
A
AZ PERIOD OF TIME
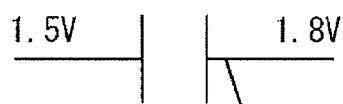
RESET LEVEL PERIOD OF TIME
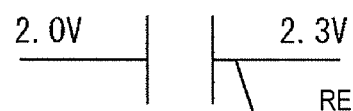 RESET LEVEL DISTRIBUTION
B

FIG. 13
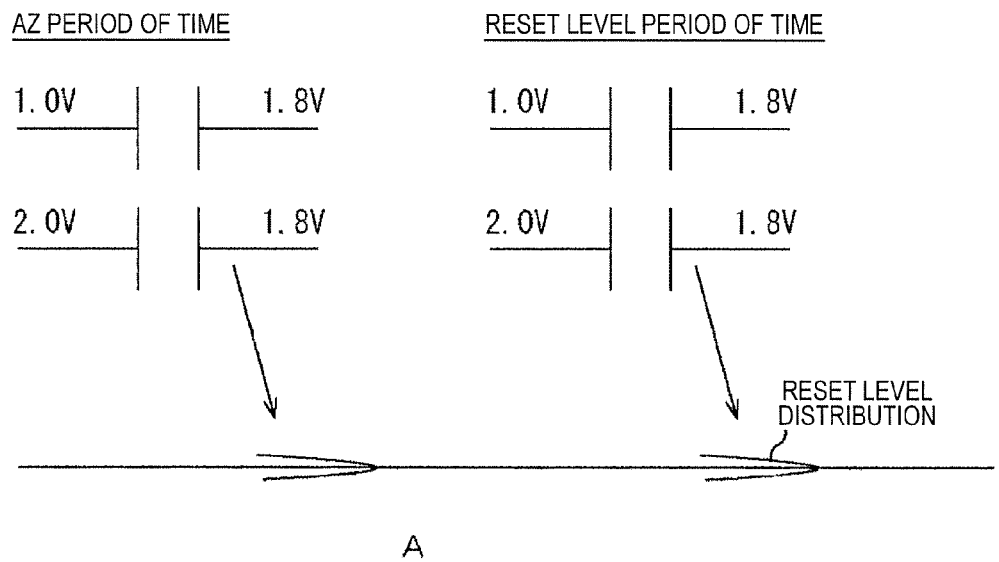
A
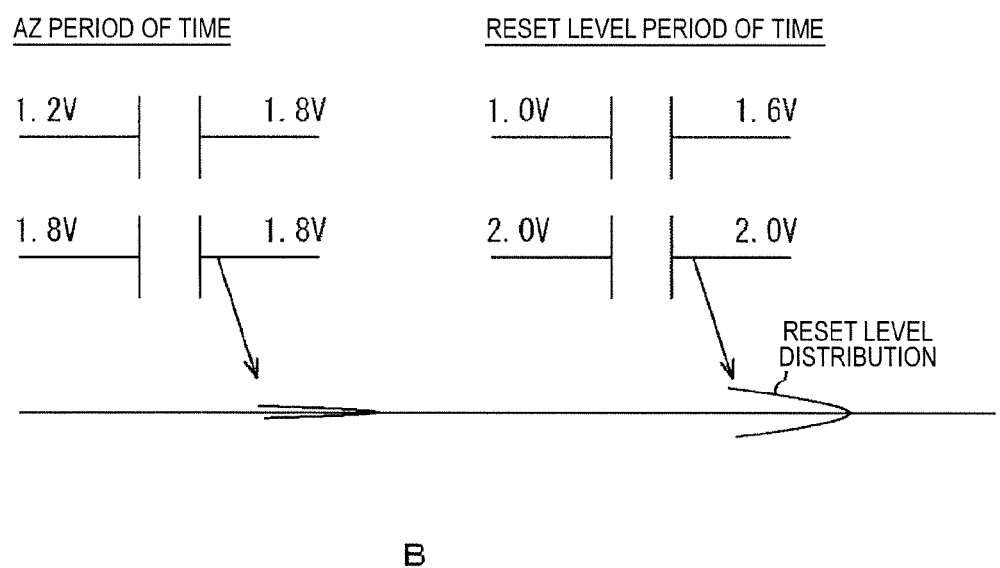
B

FIG. 19
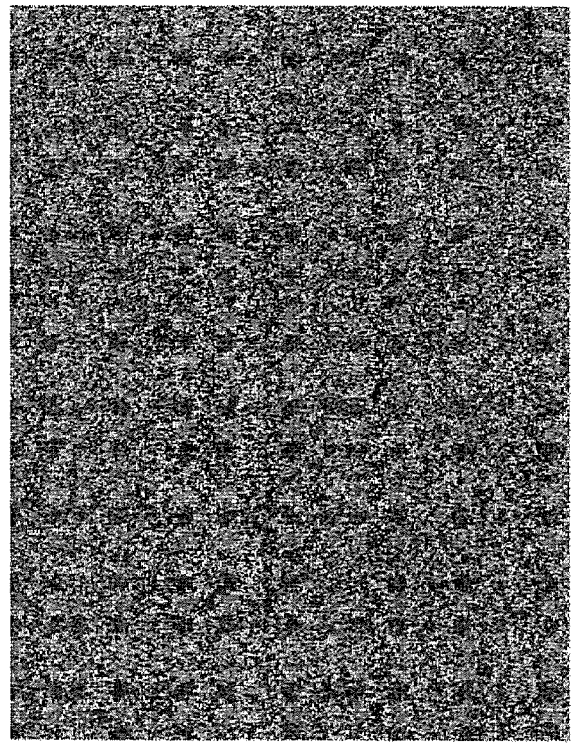
B DRIVING OF PRESENT TECHNOLOGY
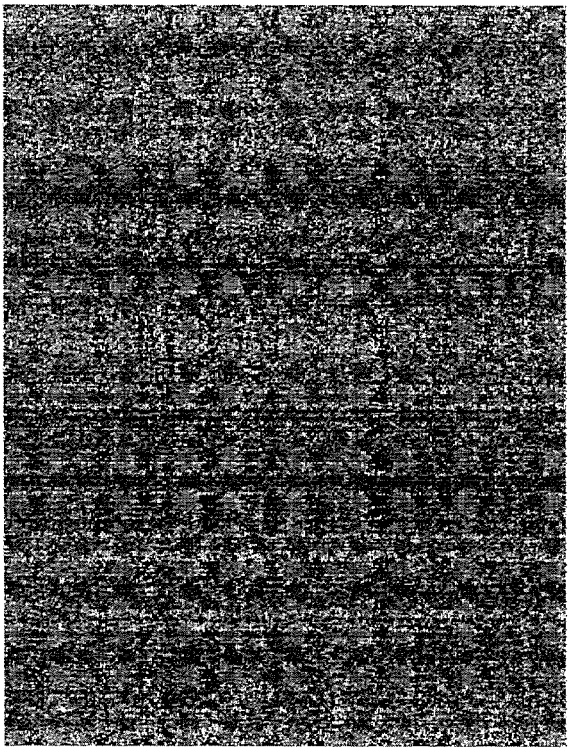
A NORMAL DRIVING ial No. 15/352,207, filed Nov. 15, 2016, which is a continuation of U.S. patent application Ser. No. 14/768,534, filed on Aug. 18, 2015, now U.S. Pat. No. 9,544,519, which is a national stage application under 35 U.S.C. 371 and claims the benefit of PCT Application No. PCT/JP2014/053597 having an international filing date of Feb. 17, 2014, which designated the United States, which PCT application claimed the benefit of Japanese Patent Application No. 2013-037868 filed Feb. 27, 2013, the disclosures of which are incorporated herein by reference in their entirety.

SOLID-STATE IMAGING DEVICE, DRIVING METHOD, AND ELECTRONIC DEVICE

CROSS REFERENCE TO RELATED APPLICATIONS

This application is a continuation of U.S. patent application Ser. No. 15/352,207, filed Nov. 15, 2016, which is a continuation of U.S. patent application Ser. No. 14/768,534, filed on Aug. 18, 2015, now U.S. Pat. No. 9,544,519, which is a national stage application under 35 U.S.C. 371 and claims the benefit of PCT Application No. PCT/JP2014/053597 having an international filing date of Feb. 17, 2014, which designated the United States, which PCT application claimed the benefit of Japanese Patent Application No. 2013-037868 filed Feb. 27, 2013, the disclosures of which are incorporated herein by reference in their entirety.

TECHNICAL FIELD

The present technology relates to a solid-state imaging device, a driving method, and an electronic device, and more particularly to, a solid-state imaging device, a driving method, and an electronic device, which are capable of suppressing deterioration of linearity in AD conversion and quantization vertical streak caused by a quantization error with a high degree of accuracy.

BACKGROUND ART

A complementary metal oxide semiconductor (CMOS) image sensor can be manufactured using the same manufacturing process as a CMOS integrated circuit (IC), driven by a single power source, and mounted within the same chip together with an analog circuit or a logic circuit using a CMOS process. Thus, it has several advantages in that the number of peripheral ICs can be reduced.

For this reason, in recent years, instead of a charge coupled device (CCD) image sensor, a CMOS image sensor has attracted attention as an image sensor.

In a CMOS image sensor, in order to read a pixel signal out to the outside, address control is performed on a pixel array section in which a plurality of unit pixels are arranged, and a pixel signal from each unit pixel is arbitrarily selected.

Further, in a CMOS image sensor, a column analog to digital (AD) converting circuit in which a slope type AD converting circuit is arranged in a column can be used as a circuit for performing AD conversion from an analog pixel signal read from a pixel array section into a digital signal.

In this type of column AD converting circuit, when a processing speed or a frame rate is increased by increasing the number of pixels arranged in the pixel array section, an inclination of a slope of a reference signal RAMP used as a reference voltage (a ramp-like voltage) for AD conversion becomes steeper. Due to this influence, particularly in low-gain or low-gradation (low-bit) reading, an AD conversion point of each column is concentrated on a point of a slope, and thus deterioration of linearity occurs due to the influence of power fluctuation or a vertical streak caused by a quantization error due to low gradation.

As a technique of preventing this phenomenon, the applicant of this application already proposed a technique in Patent Literature 1.

Patent Literature 1 discloses a technique of embedding a noise by increasing a pulse width of a reset pulse of a pixel or adjusting a pulse width of a reset pulse of a comparator at the time of reset reading of a vertical signal line and performing signal sampling in the middle of a setting period of time to input capacitance of a comparator that compares an analog pixel signal with a reference signal RAMP.

Since it is possible to spread a reset level distribution by driving using this technique, it is possible to prevent concentration of energy and suppress a quantization vertical streak caused by a quantization error by varying an operation period of time of a column AD converting circuit.

CITATION LIST

Patent Literature

Patent Literature 1: JP 2009-38834A

SUMMARY OF INVENTION

Technical Problem

Meanwhile, in the driving using the technique disclosed in Patent Literature 1, since signal sampling is performed in the middle of the reset settling period of time, a phenomenon that an average value of a reset level is shifted at the same time when the reset level distribution is spread is occurs.

In a current state in which the slope of the reference signal RAMP is too steep, in order to spread the reset level through this technique, the reset pulse of the comparator has to be released at the same time as the reset pulse of the pixel, or else it is difficult to obtain an effect. In this state, when the average value of the reset level is significantly shifted, it may be a factor that prevents counting of a counter from being performed inaccurately and causes AD conversion to be appropriately performed.

Thus, there is a demand for a driving technique capable of spreading the reset level distribution without shifting the average value of the reset level.

The present technology was made in light of the foregoing, and it is desirable to suppress deterioration of linearity in AD conversion and a quantization vertical streak caused by a quantization error with a high degree of accuracy by driving while employing a technique of spreading the reset level distribution without shifting the average value of the reset level.

Solution to Problem

According to one aspect of the present technology, there is provided a solid-state imaging device including: a pixel section configured to include a plurality of pixels arranged in a matrix form, the plurality of pixels performing photoelectric conversion; column signal lines configured to transmit pixel signals output from the pixels in units of columns; an AD converting section configured to include a comparator that compares a reference signal serving as a ramp wave with the pixel signals transmitted via the column signal line and convert a reference level and a signal level of the pixel signals into digital signals independently based on a comparison result of the comparator; a switch configured to be connected with the column signal lines; and a control section configured to turn on the switch only during a certain period of time in a period of time in which the comparator is reset and cause the column signal lines to be short-circuited.

The plurality of pixels may be arranged in the pixel section to correspond to a color filter in which colors are arranged in a certain repetitive unit. The switch may be connected to each column signal line of pixels of the same color.

The control section may adjust an ON period of time of the switch according to a gain of AD conversion performed by the AD converting section.

The control section may adjust a reset period of the comparator according to the gain of the AD conversion performed by the AD converting section.

The gain of the AD conversion performed by the AD converting section may have a value corresponding to the reference signal differing according to each color.

The switch may be a transistor. The transistor may include a gate connected to the control section via a control line and a source and a drain that are connected to a row signal line connected to the column signal line in a row direction.

The switch may be a transistor. The transistor may include a gate connected to the control section via a control line, a source connected to the column signal line, and a drain connected to a row signal line in a row direction.

The switch may be connected with all the column signal lines.

The column signal lines may be divided into blocks in a certain unit. The switch may be connected with the column signal lines in units of the blocks.

The plurality of pixels arranged in the pixel section in the matrix form may share at least an amplifying transistor and the column signal lines with other pixels.

A noise adding section configured to add a noise that is temporally unchanging and is irregular in a two-dimensional space to the pixel signals transmitted via the column signal lines may be further included.

A driving method and an electronic device according to one aspect of the present technology are a driving method and an electronic device corresponding to the solid-state imaging device of one aspect of the present technology.

In a solid-state imaging device, a driving method, and an electronic device according to one aspect of the present technology, a reference level and a signal level of pixel signals transmitted via column signal lines that transmit the pixel signals output from a pixel section in which a plurality of pixels performing photoelectric conversion are arranged in a matrix form are converted into digital signals independently based on a comparison result of a comparator that compares a reference signal serving as a ramp wave with the pixel signals, and a switch connected to the column signal lines is turned on only during a certain period of time in a period of time in which the comparator is reset, so that the column signal lines are short-circuited.

Advantageous Effects of Invention

According to one aspect of the present technology, it is possible to suppress deterioration of linearity in AD conversion and a quantization vertical streak caused by a quantization error with a high degree of accuracy.

BRIEF DESCRIPTION OF DRAWINGS

FIG. 12 is a diagram for describing adjustment of a reset level distribution using a capacitive element.

FIG. 13 is a diagram for describing adjustment of a reset level distribution using a capacitive element.

FIG. 19 is a diagram illustrating comparative examples of images obtained as a result of AD conversion.

DESCRIPTION OF EMBODIMENTS

Hereinafter, embodiments of the present technology will be described with reference to the appended drawings.

Here, in order to facilitate understanding of the present technology and clarify the background thereof, a configuration of a CMOS image sensor of a related art disclosed in Patent Literature 1 and a problem thereof will be described with reference to FIGS. 1 to 7, and then a CMOS image sensor according to the present technology will be described.

<CMOS Image Sensor of Related Art>

(Configuration of CMOS Image Sensor of Related Art)

Figure 1:
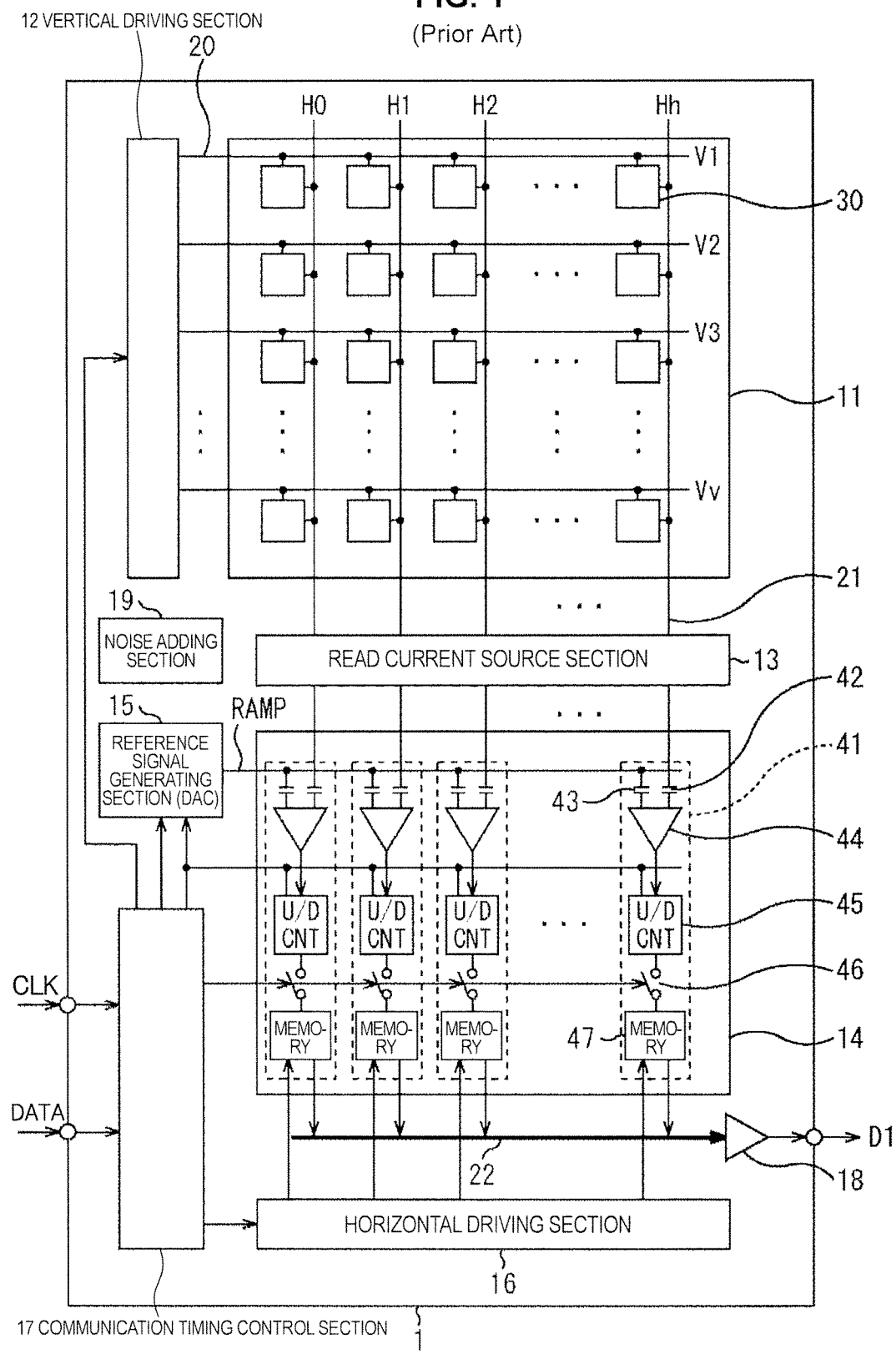
FIG. 1 is a diagram illustrating a configuration of a CMOS image sensor of a related art.

FIG. 1 is a diagram illustrating a configuration of a CMOS image sensor of a related art.

As illustrated in FIG. 1, a CMOS image sensor 1 includes a pixel array section 11 formed on a semiconductor substrate (chip) and a peripheral circuit section integrated on the same semiconductor substrate as the pixel array section 11. The peripheral circuit section includes a vertical driving section 12, a read current source section 13, a column processing section 14, a reference signal generating section 15, a horizontal driving section 16, a communication timing control section 17, an output section 18, and a noise adding section 19.

In the pixel array section 11, unit pixels 30 each including a photoelectric conversion element that generates charges of a charge quantity according to an incident light quantity and accumulates the generated charges therein are two-dimensionally arranged in a matrix form.

In FIG. 1, for the sake of simplicity of description, some rows and columns are omitted, but in reality, many unit pixels 30 are arranged in each row and each column. Typically, each of the unit pixels 30 includes a photodiode serving as a photoelectric conversion element and an in-pixel amplifier including an amplifying semiconductor device such as a transistor. For example, a floating diffusion amplifier is used as an in-pixel amplifier.

Further, in the pixel array section 11, row control lines 20 are formed in units of rows in a pixel array direction (a horizontal direction in FIG. 1) of a row of pixels with respect to the pixel array of the matrix form, and vertical signal lines 21 are formed in units of columns in a pixel array direction (a vertical direction in FIG. 1) of a column of pixels.

The vertical driving section 12 is configured with a shift register, an address decoder, and the like, and drives the pixels of the pixel array section 11 at the same time or in units of rows according to a control signal from the communication timing control section 17. A specific configuration of the vertical driving section 12 is not illustrated, but the vertical driving section 12 is commonly configured to include two scanning systems, that is, a read scanning system and a sweep scanning system.

Signals output from the unit pixels 30 of the pixel row selectively scanned by the vertical driving section 12 are supplied to the column processing section 14 via the vertical signal lines 21. Further, the vertical signal line 21 has one end extending to the column processing section 14 side, and the read current source section 13 is connected in the path of the vertical signal line 21. The read current source section 13 configures a source follower to which a substantially constant operating current (a read current) is supplied together with the amplifying transistor of the unit pixel 30.

The column processing section 14 has an AD converting function of converting a reset level serving as a reference level of pixel signals transmitted from the unit pixels 30 of a selected row via the vertical signal line 21 and a signal level into digital signals independently for each pixel column of the pixel array section 11 and a differential processing function of acquiring a digital signal of a signal component indicated by a difference between an AD conversion result of the reset level and an AD conversion result of the signal level.

Specifically, the pixel signal output from each unit pixel 30 is input to a column AD converting section 41 of the column processing section 14 via the vertical signal line 21. A reference signal generating section (digital analog converter (DAC)) 15 generates a reference signal RAMP having a ramp-like voltage according to the control signal from the communication timing control section 17, and supplies the reference signal RAMP to each column AD converting section 41.

Then, when the reference signal RAMP is supplied from the reference signal generating section 15, each column AD converting section 41 starts counting in a clock signal at the same time at which the reference signal RAMP is supplied from the reference signal generating section 15. Then, each column AD converting section 41 compares the input pixel signal with the reference signal RAMP, and performs counting until the input pixel signal is found to match the reference signal RAMP as a result of comparison, so that AD conversion is performed.

The details of the column processing section 14 and the reference signal generating section 15 will be described later.

The horizontal driving section 16 is configured with a shift register, an address decoder, and the like, and sequentially selects unit circuits of the column processing section 14 corresponding to the pixel column according to the control signal from the communication timing control section 17. Through the selective scanning function of the horizontal driving section 16, a count value held in the column processing section 14 is read out.

A horizontal signal line 22 includes a signal line of an n-bit width corresponding to a bit width of the column AD converting section 41, and is connected to the output section 18 via n sense circuits (not illustrated) corresponding to respective output lines (not illustrated).

The communication timing control section 17 is configured with a timing generator that generates a clock necessary for an operation of each section or a pulse signal of a certain timing or the like. The communication timing control section 17 generates a clock or a pulse signal based on a master clock (CLK) acquired from the outside or data (DATA) indicating an operation mode or the like, and performs driving control of the respective sections of the CMOS image sensor 1 such as the vertical driving section 12, the column processing section 14, the reference signal generating section 15, and the horizontal driving section 16.

The noise adding section 19 adds a certain noise to a pixel signal transmitted via the vertical signal line 21.

Specifically, the noise adding section 19 changes an on/off timing (for example, a reset release timing of a comparator 44 which will be described later) of a driving pulse for driving the unit pixel 30 and an AD conversion timing, and controls a bias current (a read current of the unit pixel 30) of the vertical signal line 21. Further, a noise signal that does not change temporally but has a different noise level according to a two-dimensional pixel position is included in the pixel signal transmitted via the vertical signal line 21.

In other words, when a temporally changing noise is added to the pixel signal, it is difficult to remove the noise, but a two-dimensional spatial random noise that does not change temporally can be removed by performing differential processing between the reset level and the signal level in connection on the pixel signal at the same pixel position. As described above, the noise adding section 19 can operate in collaboration with some functions of the column AD converting section 41.

Through the above configuration, the pixel signals are sequentially output from the pixel array section 11 in units of rows for each vertical column. Then, one image corresponding to the pixel array section 11 in which the photoelectric conversion elements are arranged in a matrix form, that is, an image of one frame is obtained as a set of pixel signals of the entire pixel array section 11.

(Detailed Configurations of Column Processing Section and Reference Signal Generating Section)

Here, detailed configurations of the column processing section 14 and the reference signal generating section 15 of FIG. 1 will be described.

The reference signal generating section 15 generates a step-like saw-tooth wave (a ramp waveform) based on the control signal from the communication timing control section 17. The reference signal generating section 15 supplies the generated saw-tooth wave to the column AD converting sections 41 of the column processing section 14 as an AD conversion reference signal RAMP (an ADC reference voltage).

The control signal supplied from the communication timing control section 17 to the reference signal generating section 15 includes information for equalizing a change rate of a digital signal to time so that ramp voltages of respective comparison processes have the same inclination (change rate). Specifically, it is desirable to change a count value one by one for each unit time.

The column AD converting section 41 is disposed for each column of the unit pixels 30 configuring the pixel array section 11. Each of the column AD converting sections 41 is configured with a capacitive element 42, a capacitive element 43, the comparator 44, a counter 45, a switch 46, and a memory 47.

One electrode of the capacitive element 42 is connected to the vertical signal line 21 of the vertical column corresponding thereto in common with one electrode of the other capacitive element 42, and the pixel signal from the unit pixel 30 is input to one electrode of one capacitive element 42. Further, one input terminal of the comparator 44 is connected to the other electrode of the capacitive element 42.

One electrode of the capacitive element 43 receives the reference signal RAMP from the reference signal generating section 15 in common with one electrode of the other capacitive element 43, and the other electrode of the capacitive element 43 is connected with the other input terminal of the comparator 44.

The capacitive elements 42 and 43 are used for signal coupling, and cut (DC-cut) a DC component of the signal input to the comparator 44.

One input terminal of the comparator 44 is connected with the other electrode of the capacitive element 42 and receives the DC-cut pixel signal, and the other input terminal of the comparator 44 is connected with the other electrode of the capacitive element 43 and receives the DC-cut reference signal RAMP.

The comparator 44 compares the reference signal RAMP with the pixel signals obtained from the unit pixels 30 via the vertical signal line 21 (H0, H1, . . . , Hh) for each row control line 20 (V0, V1, . . . , Vv). An output terminal of the comparator 44 is connected to the counter 45, and the comparator 44 outputs a comparison processing result to the counter 45.

The communication timing control section 17 has a function of switching a mode of a count process in the counter 45 according to whether the comparator 44 performs the comparison process on the reset level or the signal of the pixel signal. Further, the count mode includes a down count mode and an up count mode.

A count clock from the communication timing control section 17 is input to a clock terminal of the counter 45 and a clock terminal of the other counter 45 in common. The counter 45 is configured to be able to switch a down-count operation and an up-count operation alternately using a common up-down counter (U/D CNT) regardless of a count mode and perform a count process.

The counter 45 has a latch function of holding a count result, and holds the counter value until an instruction is given through the control signal from the horizontal driving section 16.

Further, the n-bit memory 47 that holds the count value held in the counter 45 and the switch 46 that performs a switching operation according to a counter value transfer instruction from the communication timing control section 17 are disposed behind the counter 45. The switch 46 transfers the counter value of the counter 45 to the memory 47 according to the transfer instruction from the communication timing control section 17, and causes the counter value to be stored in the memory 47.

The memory 47 holds the count value acquired from the counter 45 until an instruction is given through the control signal from the horizontal driving section 16. The count value held in the memory 47 is read out through the horizontal driving section 16.

The column AD converting sections 41 having the above configuration is arranged for each vertical signal line 21 (H0, H1, Hh) as described above, so that the column processing section 14 serving as an ADC block of a column parallel configuration is configured. In this configuration, the column AD converting section 41 performs the count operation during a pixel signal read period of time corresponding to a horizontal blanking period of time, and outputs a count result at a certain timing.

In other words, the comparator 44 compares a voltage level of the reference signal RAMP of a ramp waveform increasing or decreasing at a certain inclination with a voltage level of the pixel signal of the pixel signal from the unit pixel 30, and inverts its output when the two voltage levels are equal to each other. Further, the counter 45 starts the count operation in either the down-count mode or the up-count mode in synchronization with the ramp waveform voltage output from the reference signal generating section 15, and when information that the output of the comparator 44 is inverted is notified of, the counter 45 stops the count operation, and completes the AD conversion by holding the count value at that point in time.

Thereafter, the counter 45 sequentially outputs pixel data held therein to the outside of the chip having the pixel array section 11 and the like through the output section 18 and the like based on a shift operation by a horizontal selection signal input from the horizontal driving section 16 at a certain timing.

In FIG. 1, for the sake of simplicity of description, for example, various kinds of circuits that do not relate directly to the description of the present embodiment are not illustrated, but for example, there are cases in which a signal processing circuit or the like is included as a component of the CMOS image sensor 1.

The CMOS image sensor 1 of FIG. 1 has the above-described configuration.

(Configuration of Unit Pixel)

Next, a configuration example of the unit pixel 30 arranged in the pixel array section 11 of the CMOS image sensor 1 of FIG. 1 and a connection form between a driving control line and a pixel transistor will be described with reference to FIG. 2.

Figure 2:
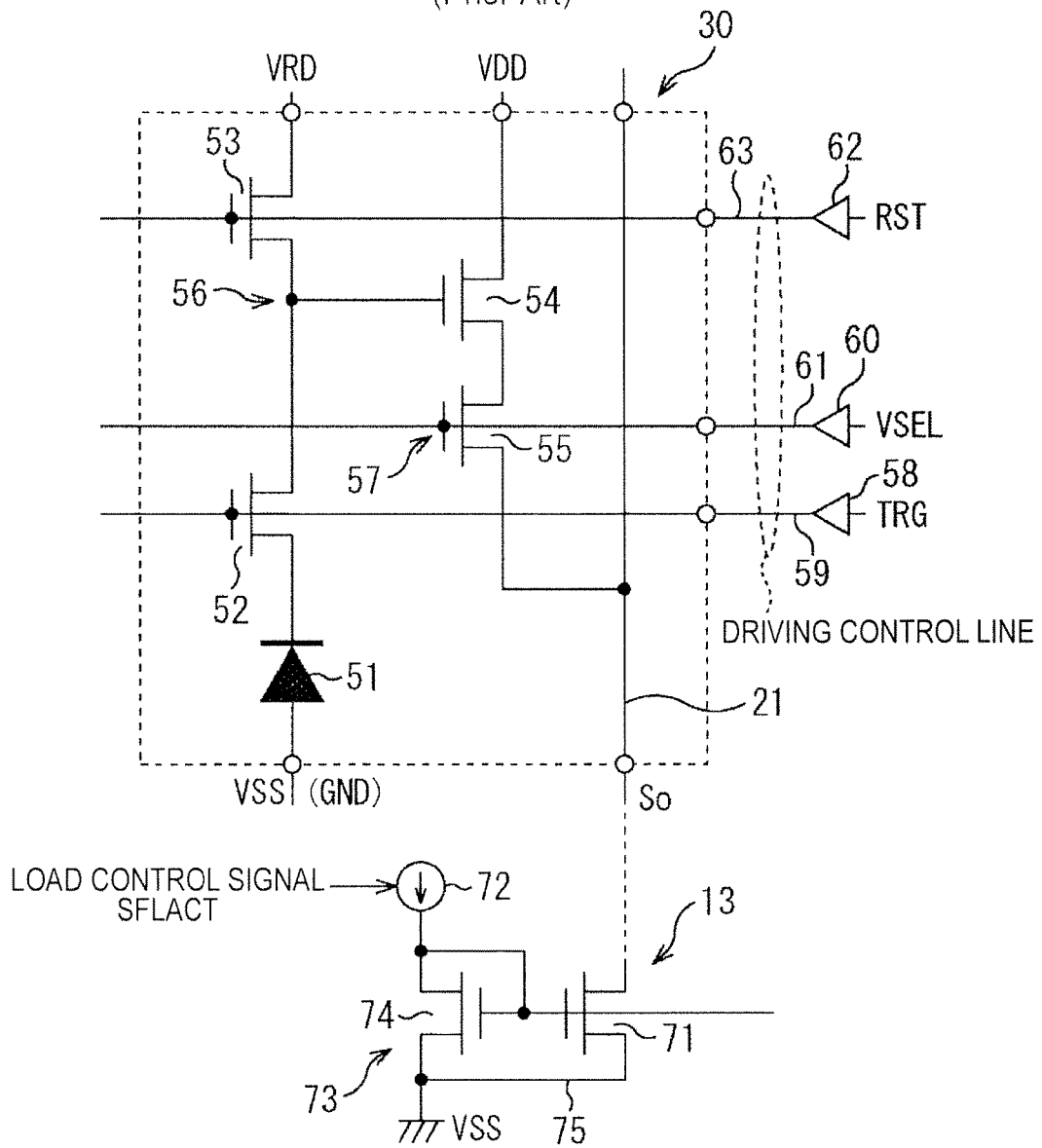
FIG. 2 is a diagram illustrating a configuration and a connection form of a unit pixel.

As illustrated in FIG. 2, as a configuration of the unit pixel 30 in the pixel array section 11, for example, a 4 TR structure including four transistors may be employed.

The unit pixel 30 includes, for example, a diode 51 as a photoelectric conversion element, and includes four transistors, that is, a transfer transistor 52, a reset transistor 53, an amplifying transistor 54, and a vertical selecting transistor 55 as active elements for one photodiode 51. The unit pixel 30 further includes a pixel signal generating section 57 of a floating diffusion amplifier configuration (floating diffusion AMP (FDA)) configured with a floating diffusion 56.

The photodiode 51 performs photoelectric conversion of converting incident light into a quantity of charges according to a quantity of light. The transfer transistor 52 is arranged between the photodiode 51 and the floating diffusion 56.

As a driving pulse TRG is applied to a transfer gate from a transfer driving buffer 58 via a transfer line 59, the transfer transistor 52 transfers the electrons obtained by the photoelectric conversion in the photodiode 51 to the floating diffusion 56.

The floating diffusion 56 is connected with a gate of the amplifying transistor 54. The amplifying transistor 54 is connected to the vertical signal line 21 via the vertical selecting transistor 55, and configures the source follower (the pixel source follower) together with the read current source section 13 disposed outside the unit pixel 30.

When the unit pixel 30 is selected as a selection pixel from among a number of unit pixels connected to the vertical signal line 21, a vertical selection pulse VSEL is applied to a gate of the vertical selecting transistor 55 from a selective driving buffer 60 via a vertical selection line 61, the vertical selecting transistor 55 is turned on, and the amplifying transistor 54 is connected with the vertical signal line 21. The amplifying transistor 54 amplifies a potential of the floating diffusion 56, and outputs a voltage according to the potential to the vertical signal line 21. A signal voltage output from each pixel is output to the column processing section 14 as a pixel signal (So) via the vertical signal line 21.

The reset transistor 53 is connected between a power line VRD and the floating diffusion 56, and resets the potential of the floating diffusion 56 when a pixel reset pulse RST is applied from a reset driving buffer 62 via a reset line 63.

More specifically, when the pixel is reset, the transfer transistor 52 is turned on to discharge the charges remaining in the photodiode 51, and then the transfer transistor 52 is turned off, and the photodiode 51 converts a light signal into charges and accumulates the charges.

At the time of reading, the reset transistor 53 is turned on to reset the floating diffusion 56, the reset transistor 53 is then turned off, and the charges in the floating diffusion 56 at this time are output through the amplifying transistor 54 and the vertical selecting transistor 55. An output at this time is a reset level output (P phase output).

Then, the transfer transistor 52 is turned on to transfer the charges accumulated in the photodiode 51, and the voltage of the floating diffusion 56 at this time is output through the amplifying transistor 54. An output at this time is a signal level output (a D phase output).

Then, a difference between the signal level output (the D phase output) and the reset level output (the P phase output) is used as a pixel signal, and thus it is possible to remove the reset noise of the floating diffusion 56 from the pixel signal while preventing a variation in an output DC component of each pixel. For example, this operation is performed simultaneously on the pixels of one row since the gates of the transfer transistors 52, the vertical selecting transistors 55, and the reset transistor 53 are connected in units of rows.

The read current source section 13 includes an NMOS transistor 71 (hereinafter, referred to as a "load NMOS transistor 71") disposed in each vertical column, a current generating section 72 shared by all vertical columns, and a reference power supply section 73 including an NMOS transistor 74. The source line 75 is connected to a ground serving as a substrate bias at an end portion in a vertical direction, and the operating current (the read current) on the ground of the load NMOS transistor 71 is supplied from both left and right ends of the chip.

A drain of each load NMOS transistor 71 is connected to the vertical signal line 21 of a corresponding column, a source thereof is connected to the source line 75 serving as a grounding wire. Thus, the gate of the load NMOS transistor 71 of each vertical column is connected with a gate of a transistor 74 of the reference power supply section 73 to configure a current mirror circuit, and functions as a current source on the vertical signal line 21.

A load control signal SFLACT for outputting a certain current only when necessary is supplied from a load control section (not illustrated) to the current generating section 72. At the time of reading, the load control signal SFLACT of an active state is input to the current generating section 72, and the current generating section 72 causes a predetermined current to continuously flow to each amplifying transistor 54 through the load NMOS transistor 71 connected via the vertical signal line 21.

In other words, the load NMOS transistor 71 configures the source follower with the amplifying transistor 54 of the selected row, supplies the read current to the amplifying transistor 54, and outputs the pixel signal (So) to the vertical signal line 21.

(Configuration of Comparator)

Next, the details of the comparator 44 disposed in each column AD converting section 41 of FIG. 1 will be described with reference to FIG. 3.

The comparator 44 employs a different amplifier configuration as a basic configuration, and includes a differential transistor pair section 81, a load transistor pair section 82 serving as an output load of the differential transistor pair section 81, and a current source section 83.

The differential transistor pair section 81 includes NMOS transistors 84 and 85. The load transistor pair section 82 includes PMOS transistors 86 and 87. The current source section 83 includes an NMOS constant current source transistor 88, and supplies a constant operating current to the differential transistor pair section 81 and the load transistor pair section 82.

Sources of the transistors 84 and 85 are connected to a drain of a constant current source transistor 86 of the current source section 83 in common, and drains of the transistors 84 and 85 are connected to drains of the corresponding transistors 86 and 87 of the load transistor pair section 82. A DC gate voltage is input to a gate of the constant current source transistor 88.

An output (the drain of the transistor 85 in the example of FIG. 3) of the differential transistor pair section 81 is connected to an amplifier (not illustrated), passes through a buffer (not illustrated), and is sufficiently amplified and then output to the counter 45 (FIG. 1).

Further, an operation point reset section 91 that resets an operation point of the comparator 44 is disposed. The operation point reset section 91 functions as an offset removing section. In other words, the comparator 44 is configured as a voltage comparator with an offset removing function. The operation point reset section 91 includes switching transistors 92 and 93.

The switching transistor 92 is connected between the gate and the drain of the transistor 84. The switching transistor 93 is connected between the gate and the drain of the transistor 85. A comparator reset pulse PSET is supplied to gates of the switching transistors 92 and 93 in common.

The pixel signal is input to the gate of the transistor 84 via the capacitive element 42 (FIG. 1) for signal coupling. Further, the pixel signal is input to the gate of the transistor 85 via the capacitive element 43 (FIG. 1) for signal coupling.

In the above configuration, the operation point reset section 91 performs a sample/hold function on signals input through the capacitive elements 42 and 43.

In other words, the comparator reset pulse PSET becomes active (for example, an H level) only immediately before a comparison of the pixel signal and the reference signal RAMP starts, and the operation point of the differential transistor pair section 81 is reset to a drain voltage (a read potential; an operation reference value for reading a reference component or a signal component).

Thereafter, the pixel signal is input to the transistor 84 via the capacitive element 42, the reference signal RAMP is input to the transistor 85 via the capacitive element 43, and the comparison is performed until the pixel signal and the reference signal RAMP become the same potential. Then, when the pixel signal and the reference signal RAMP become the same potential, the output is inverted.

In the following description, a state in which the comparator reset pulse PSET becomes active is also referred to as an "auto zero (AZ)."

Figure 3:
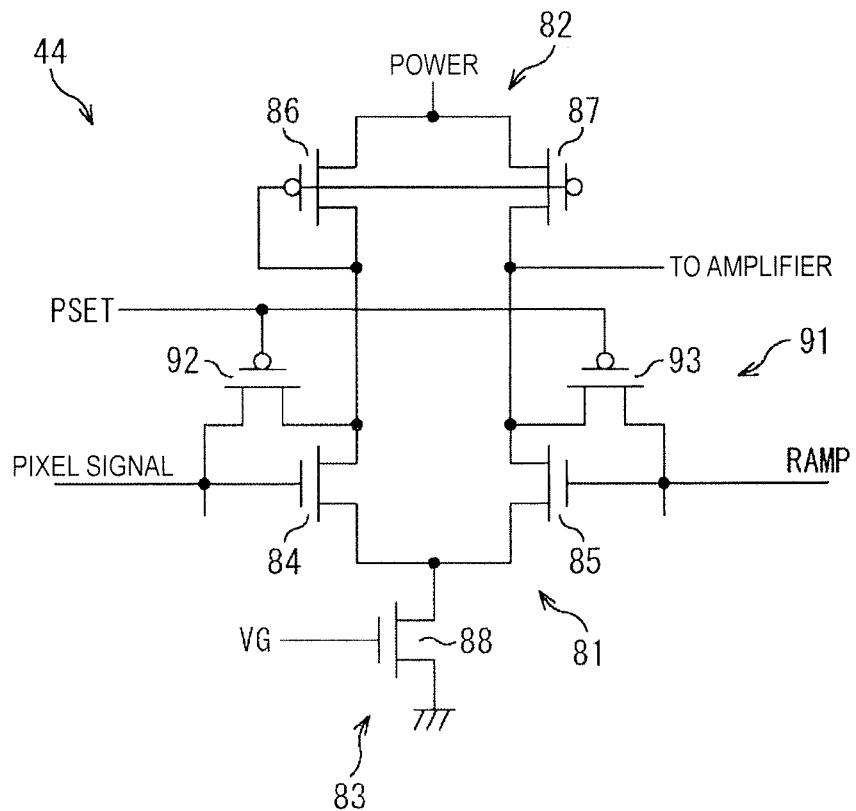
FIG. 3 is a diagram illustrating a configuration of a comparator.

Further, for the sake of convenience of description, the capacitive elements 42 and 43 of FIG. 1 have been described as being disposed outside the comparator 44, but the capacitive elements 42 and 43 may be disposed in the comparator 44 of FIG. 3 and configured as a part of the operation point reset section 91. In this case, the capacitive element 42 is arranged between the input terminal to which the pixel signal is input and the gate of the transistor 84, and the capacitive element 43 is arranged between the input terminal to which the reference signal RAMP is input and the gate of the transistor 85. Further, the input of the pixel signal and the input of the reference signal RAMP may be reversed.

(Problem of AD Conversion in CMOS Sensor of Related Art)

Meanwhile, in the CMOS image sensor 1, when the AD conversion is performed, the concentration of the energy is prevented, or the vertical streak caused by the quantization error is suppressed such that the operation period of time of the column AD converting section 41 is varied by injecting a certain noise through the noise adding section 19 or the like and spreading the reset level distribution, but a phenomenon in which the average value of the reset level is shifted at the same time at which the reset level distribution is spread occurs.

The reason for which this phenomenon occurs was found through a detailed simulation performed by the inventor(s) of the present technology. In this regard, the details of a mechanism in which the average value of the reset level is shifted will be described below with reference to FIGS. 4 to 7.

Here, in normal reading and AD conversion of the pixel signal, after the reset level appearing on the vertical signal line 21 is sufficiently stabilized, and then the AD conversion is performed on the reset level. On the other hand, in the CMOS image sensor 1, the AD conversion is performed on the reset level before the reset level appearing on the vertical signal line 21 is stabilized, and thus the AD conversion is performed on the reset level of an unstable state.

This means that the reset noise is mixed into the AD conversion result, but since the amount of the reset noise differs according to each pixel, a mixing state differs according to each pixel as well, and a two-dimensionally irregular noise is consequently mixed into the AD conversion result of the reset level.

Further, as a technique of performing AD conversion on the reset level of the unstable state, Patent Literature 1 discloses a technique of adjusting an interval (hereinafter, a "reset release interval TRelease") between a timing at which the pixel reset pulse RST is turned off and a timing at which the comparator reset pulse PSET for resetting the comparator 44 is turned off so that the interval is smaller than a generally employed interval.

Figure 4:
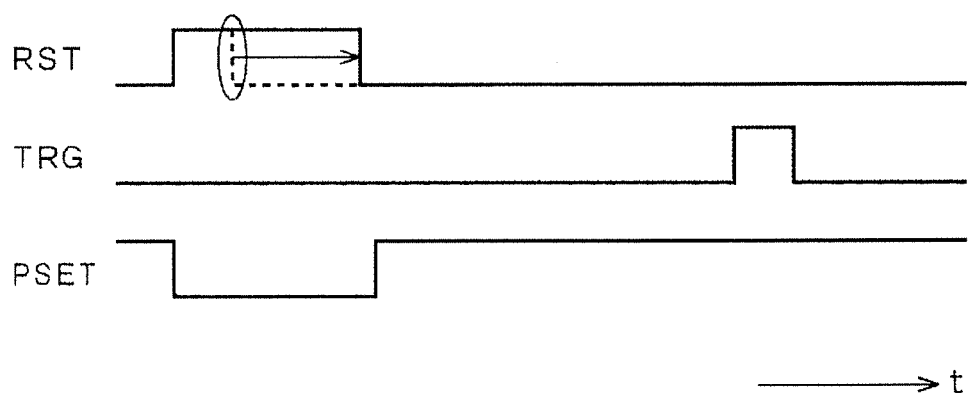
FIG. 4 is a diagram for describing driving in which a pulse width of a pixel reset pulse RST is adjusted.

In other words, as illustrated in FIG. 4, by shifting a timing at which the pixel reset pulse RST is turned off to a later timing and reducing the reset release interval TRelease, the reset state of the comparator 44 is purposely released at a timing at which the reset noise is unstable. Thus, an irregular noise can be injected into the AD conversion result of the reset level.

Figure 5:
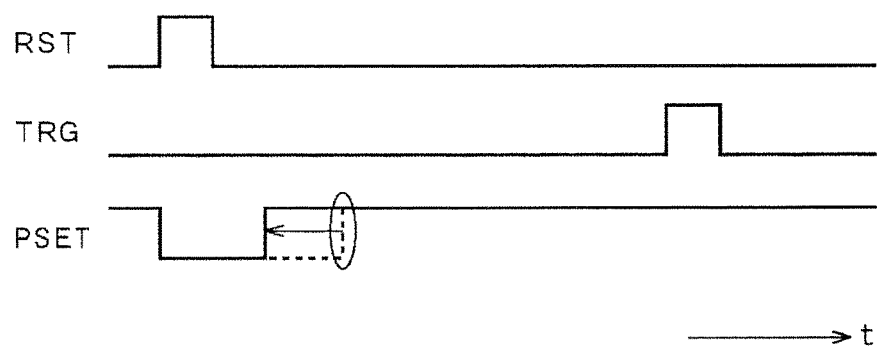
FIG. 5 is a diagram for describing driving in which a pulse width of a comparator reset pulse PSET is adjusted.

Similarly, as illustrated in FIG. 5, by shifting a timing at which the comparator reset pulse PSET is turned off to a previous timing and reducing the reset release interval TRelease, an irregular noise can be injected into the AD conversion result of the reset level.

As described above, in the CMOS image sensor 1, by performing signal sampling in the middle of a settling period of time to the input capacitance of the comparator 44, the irregular noise is injected into the AD conversion result of the reset level, and the reset level distribution is spread.

Figure 6:
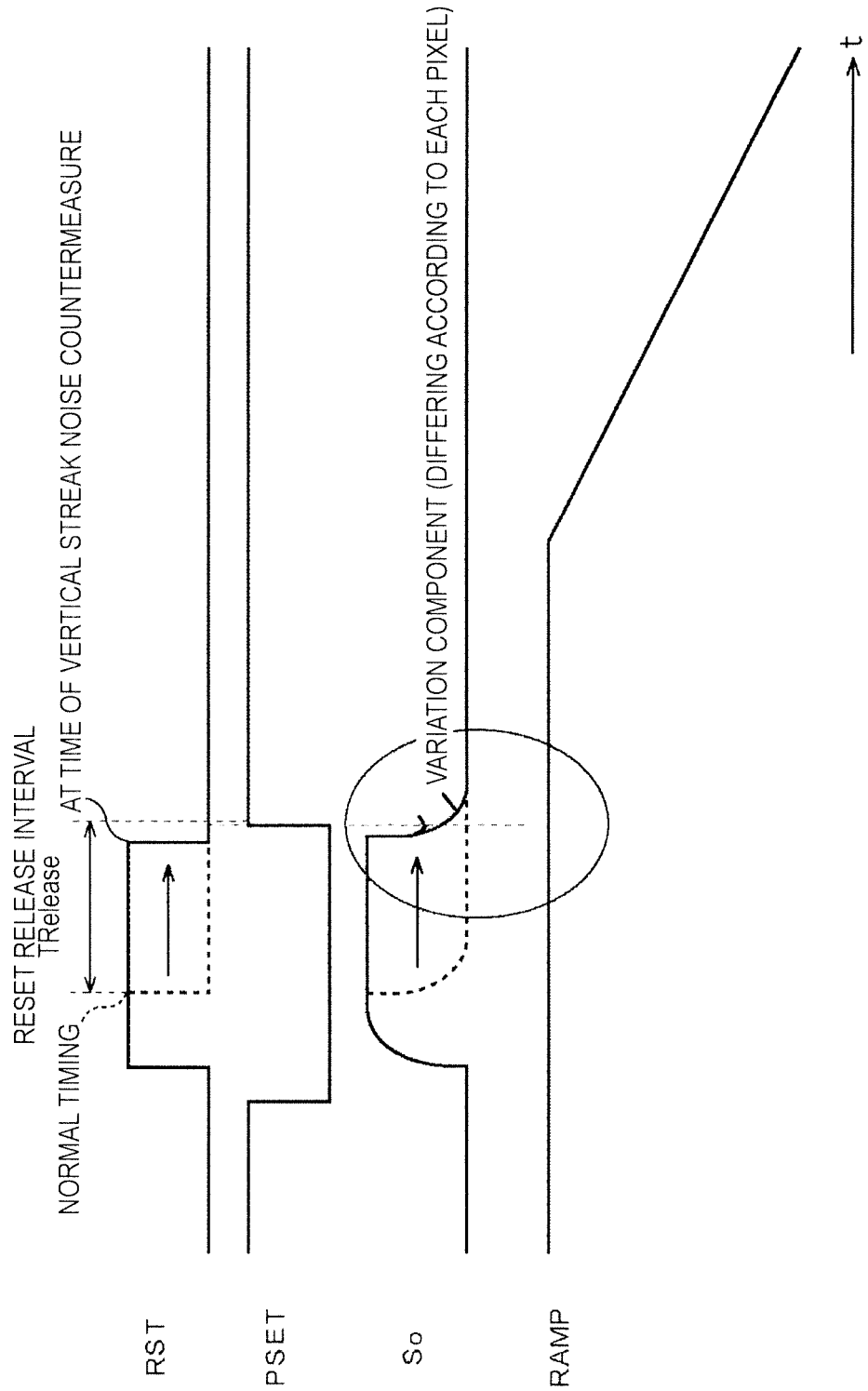
FIG. 6 is a diagram for describing a mechanism in which a reset level average value is shifted.

Specifically, as illustrated in a timing chart of FIG. 6, according to a normal driving timing, as indicated by a dotted line in FIG. 6, after the pixel reset pulse RST is input and then a reset noise component appearing on the vertical signal line 21 is stabilized, the comparator reset pulse PSET for the comparator 44 is turned off, and thus the offset component of the pixel signal (So) is completely removed.

On the other hand, according to a driving timing of the CMOS image sensor 1, as indicated by a solid line, when a noise component is injected, a timing at which the pixel reset pulse RST is turned off is purposely shifted to a later timing, and thus the reset release interval (TRelease) is reduced. As a result, the reset state of the comparator 44 is purposely released at a timing at which the reset noise is unstable. This means that a two-dimensionally irregular noise is injected by controlling the pulse width of the pixel reset pulse RST for pixel reset and a settling amount of the reset noise of the pixel.

As a result, the unstable reset noise component is mixed into the AD conversion result of the reset level, but since the amount of the reset noise differs according to each pixel as described above, mixing states are various, and a two-dimensionally irregular noise can be consequently mixed into the AD conversion result of the reset level.

Further, since there is a time from the reset release of the comparator 44 to the actual slope start of the reference signal RAMP (that is, the AD conversion start), this period of time is set to an operation timing in which the reset noise component of the vertical signal line 21 is completely stable, and thus the reset level does not vary between the time of AD conversion on the subsequent reset level and the time of AD conversion on the signal level. Thus, a noise component that is temporally random is not included, and image quality does not deteriorate.

In other words, practically, a two-dimensionally irregular fixed pattern noise of the same amount is injected into the reset level and the signal level of the pixel signal, AD conversion is performed, and the differential process is performed on each AD conversion result, and thus the digital signal of the signal component is acquired in a state in which a quantization noise generated in association with the differential process becomes random in a two-dimensional space.

As described above, the CMOS image sensor 1 operates according to the driving timing of FIG. 6 and spreads the reset level distribution, and thus the CMOS image sensor 1 prevents concentration of energy, prevents a phenomenon in which a quantization error occurring in association with the differential process is accumulated for each column, and suppresses an unnatural noise of a vertical streak form.

However, in the case of the driving timing of FIG. 6, since signal sampling is performed in the middle of the settling period of time, the reset level distribution is not spread, and the phenomenon in which the average value of the reset level is shifted occurs.

Figure 7:
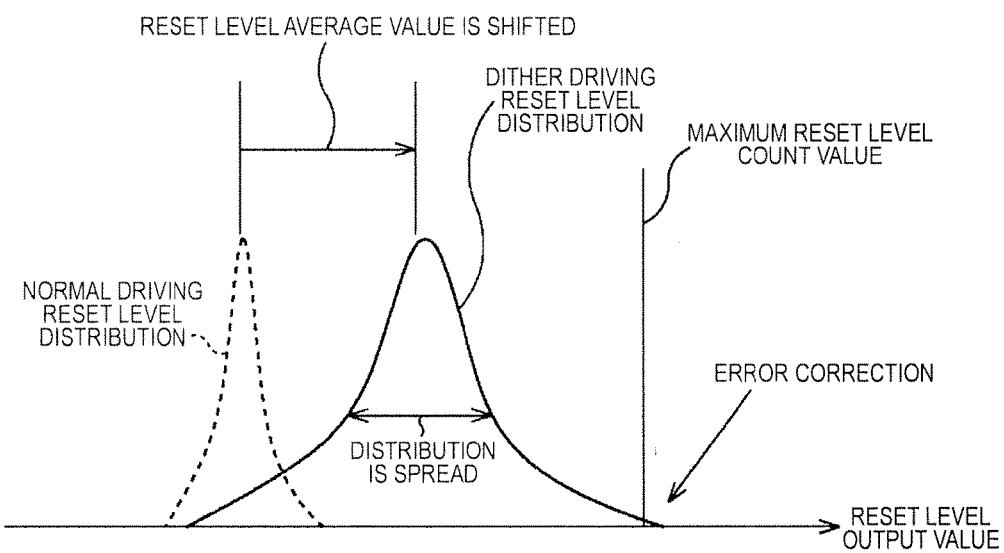
FIG. 7 is a diagram schematically illustrating a reset level distribution when a reset level average value is shifted.

FIG. 7 is a diagram schematically illustrating the reset level distribution when the average value of the reset level is shifted.

In FIG. 7, a horizontal axis denotes a reset level output value, and a vertical axis denotes the frequency thereof. Further, in FIG. 7, driving according to a driving timing indicated by a dotted line in FIG. 6 is referred to as "normal driving," and driving according to a driving timing indicated by a solid line in FIG. 6 is referred to as "dither driving."

In the normal driving, since noise injection is not performed, as indicated by a dotted line in FIG. 7, the reset level distribution does not flare but is concentrated near the average value. Further, since noise injection is not performed, the reset level output value does not become as large. Thus, the reset level output value does not exceed a maximum reset level count value.

On the other hand, in the dither driving, since noise injection is performed through the noise adding section 19 or the like, the reset level distribution is spread, but as noise is injected, the reset level output value increases accordingly, and thus the average value is shifted to the right in FIG. 7 compared to the case of the normal driving. Thus, a case in which the reset level output value exceeds the maximum reset level count value occurs.

As described above, when the average value of the reset level is significantly shifted so that the reset level output value exceeds the maximum value in which the reset level can be counted, accurate counting by the counter 45 may not be performed, and the AD conversion may not be appropriately performed. In order to prevent this phenomenon, it is necessary to suppress the shift of the average value of the reset level, but the inventor of the present technology has found a technique of suppressing the shift of the average value of the reset level. In this regard, the CMOS image sensor according to the present technology will be described below.

<CMOS Image Sensor According to Present Technology>
(Configuration Example of CMOS Image Sensor According to Present Technology)

Figure 8:
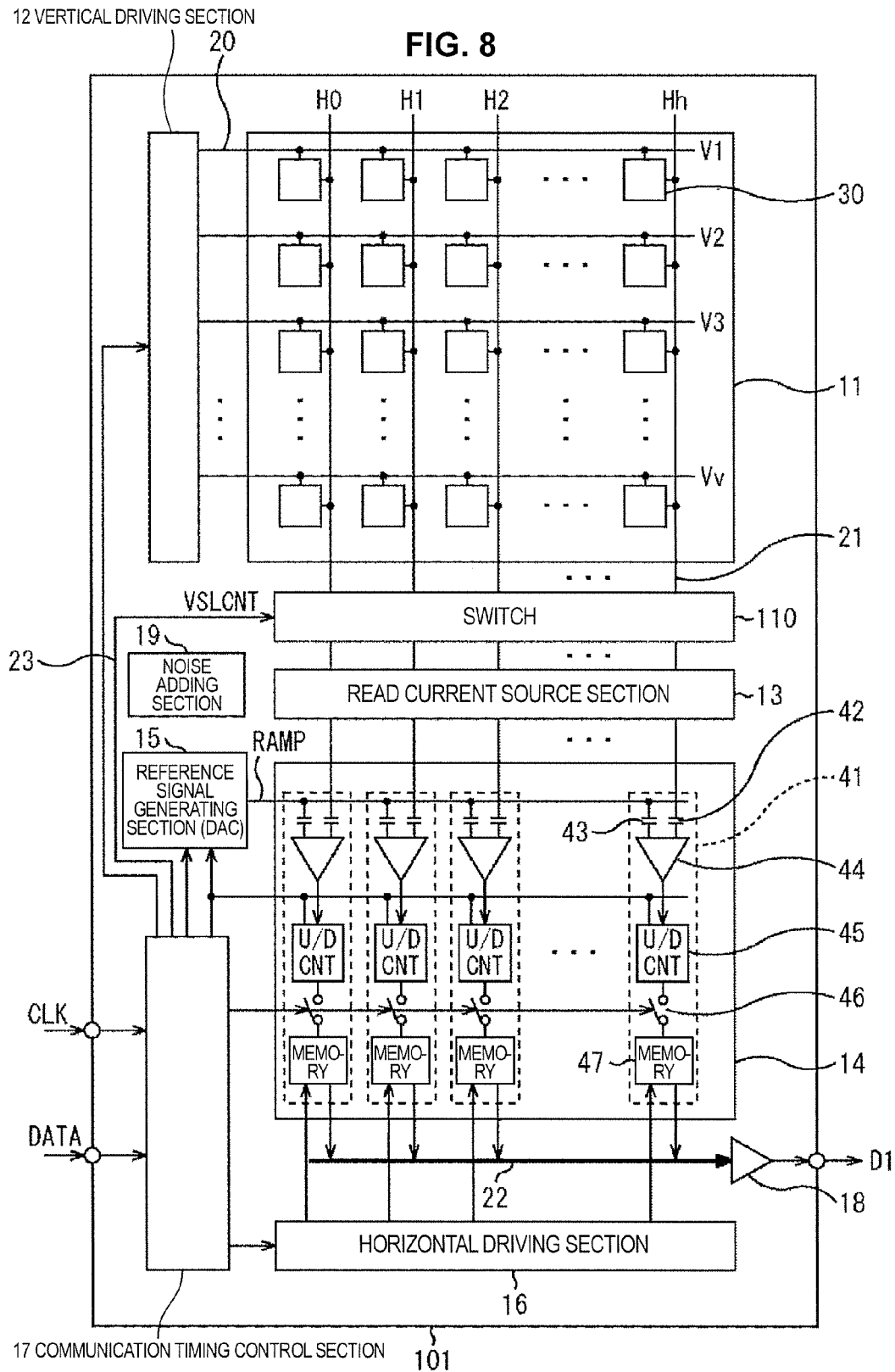
FIG. 8 is a diagram illustrating a configuration of a CMOS image sensor according to the present technology.

FIG. 8 is a diagram illustrating a configuration example of a CMOS image sensor as a solid-state imaging device according to the present technology.

In a CMOS image sensor 101 of FIG. 8, parts corresponding to those of the CMOS image sensor 1 of FIG. 1 are denoted by the same reference numerals, and a description thereof will be appropriately omitted.

In other words, the CMOS image sensor 101 differs from the CMOS image sensor 1 in that a switch 110 is disposed between the pixel array section 11 and the read current source section 13.

The switch 110 is connected to the vertical signal lines 21. The switch 110 causes the vertical signal lines 21 to be short-circuited according to a control pulse VSLCNT input from the communication timing control section 17 via a control line 23. Then, when the vertical signal lines 21 are short-circuited, a potential of each vertical signal line 21 becomes an average potential, and this is stored, and thus the shift of the average value of the reset level can be suppressed.

Here, a technique of suppressing the shift of the average value of the reset level will be described in further detail with reference to FIGS. 9 to 13.

Figure 9:
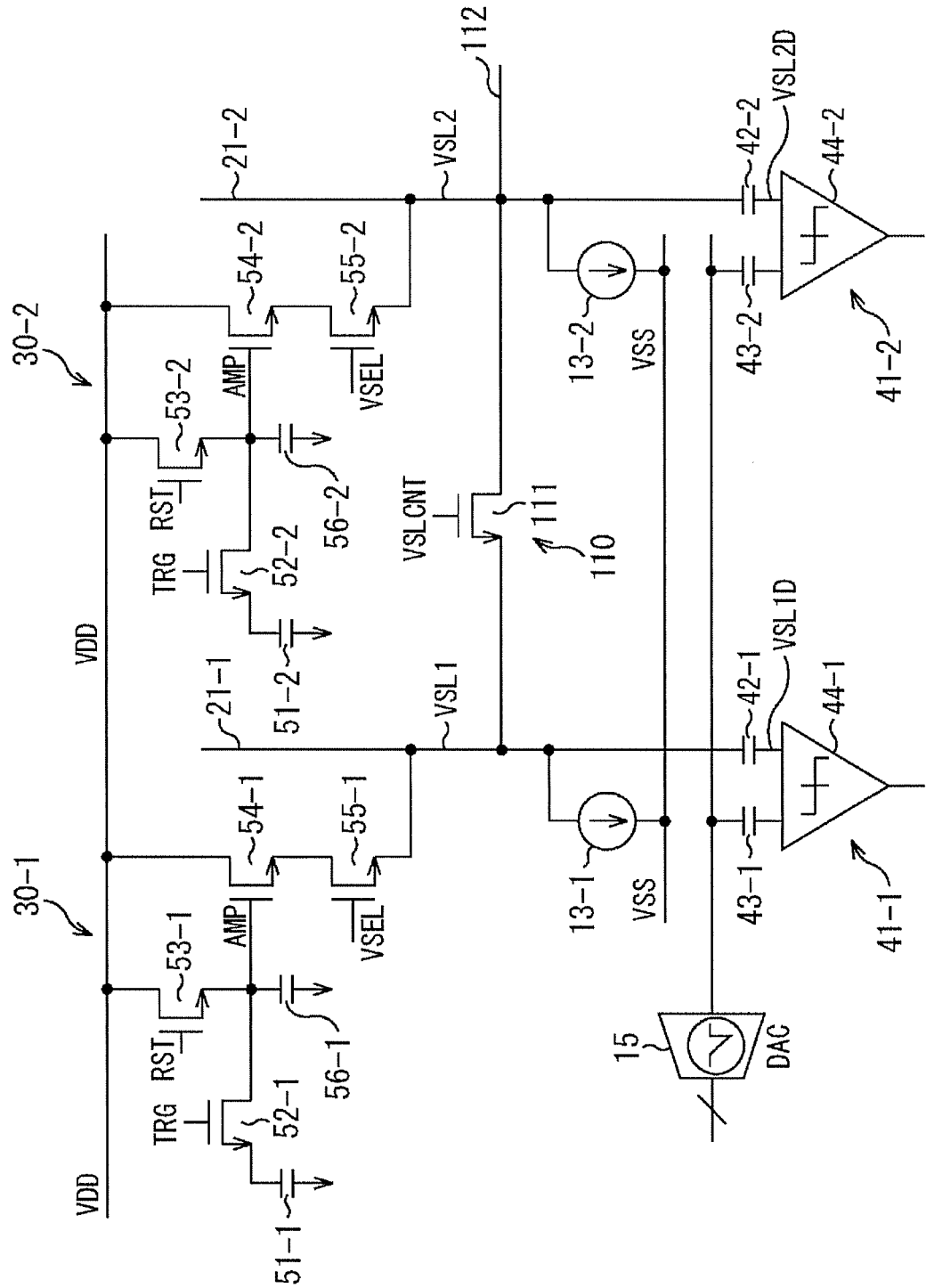
FIG. 9 is a diagram illustrating a configuration and a connection form of a switch.

In FIG. 9, for the sake of convenience of description, among the unit pixels 30 arranged in a matrix form in the pixel array section 11, a unit pixel 30-1 and a unit pixel 30-2 are illustrated. In FIG. 9, parts corresponding to those of FIG. 2 are denoted by the same reference numerals, and a description thereof will be omitted.

In the unit pixel 30-1, an amplifying transistor 54-1 is connected with a vertical signal line 21-1 via a vertical selecting transistor 55-1, and configures the source follower together with a read current source section 13-1. In FIG. 9 and the like, an output of the source follower is indicated by "VSL1."

A column AD converting section 41-1 is connected to the vertical signal line 21-1. In the column AD converting section 41-1, the pixel signal from the unit pixel 30-1 is input to one input terminal of a comparator 44-1 via a capacitive element 42-1, and a reference signal RAMP from a reference signal generating section 15 is input to the other input terminal of the comparator 44-1 via a capacitive element 43-1. In FIG. 9 and the like, an output of the capacitive element 42-1 is indicated by "VSL1D."

Similarly, in the unit pixel 30-2, an amplifying transistor 54-2 and a read current source section 13-2 configure the source follower. A column AD converting section 41-2 is connected to a vertical signal line 21-2. In FIG. 9 and the like, an output of the source follower is indicated by "VSL2," and an output of a capacitive element 42-2 is indicated by "VSL2D."

The switch 110 is configured with a switching transistor 111. A source of the switching transistor 111 is connected with the vertical signal line 21-1 via a row signal line 112, and a drain of the switching transistor 111 is connected with the vertical signal line 21-2 via the row signal line 112. In other words, the switching transistor 111 connects the outputs of the source followers configured for each column by connecting the vertical signal lines 21 in the row direction through the row signal line 112.

A control pulse VSLCNT from the communication timing control section 17 is input to a gate of the switching transistor 111. Thus, the switching transistor 111 performs an on/off switching operation according to the control pulse VSLCNT from the communication timing control section 17.

Figure 10:
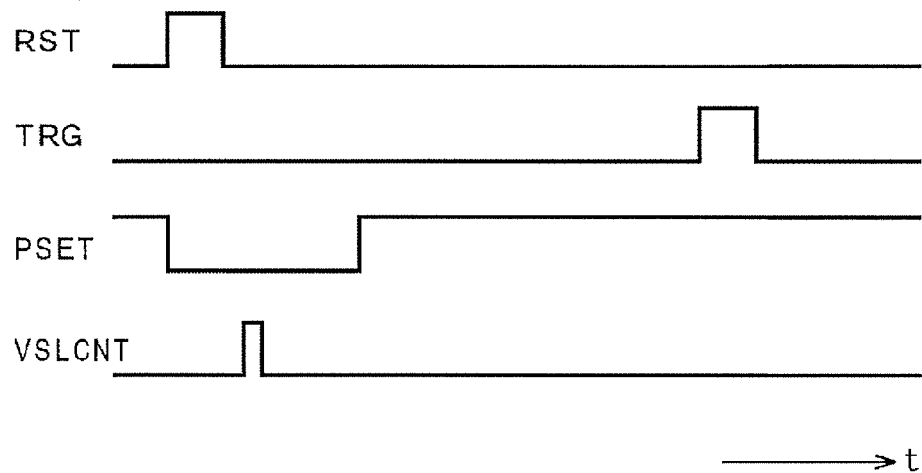
FIG. 10 is a diagram for describing driving using a control pulse VSLCNT.

For example, as illustrated in FIG. 10, the control pulse VSLCNT has the H level only during a certain period of time in a period of time in which the comparator reset pulse PSET on the comparator 44 is in the active state. Further, when the control pulse VSLCNT input to the gate becomes the H level, the switching transistor 111 enters the on state, and causes the vertical signal lines 21 connected to the row signal line 112 to be short-circuited. When the vertical signal lines 21 are short-circuited, the potential of each vertical signal line 21 becomes the average potential, and an output of the source follower of each column becomes an averaged output. For example, in FIG. 9, the outputs VSL1 and VSL2 of the source followers are averaged.

As a result, an average value of the outputs of the source followers is stored in one input terminal of the comparator 44 arranged in each column AD converting section 41 as the input capacitance.

Thereafter, when the control pulse VSLCNT input to the gate reaches the L level, the switching transistor 111 enters the off state, and returns the vertical signal lines 21 connected to the row signal line 112 to an original state before it was short-circuited. As a result, the output of each source follower of each column is returned from the average value to the output value according to a variation of a threshold voltage (Vth) of each amplifying transistor 54.

At this time, a pixel signal corresponding to the variation of the threshold voltage of each amplifying transistor 54 from the average value of the outputs of the source followers stored during the period of time (the auto zero period of time) in which the comparator reset pulse PSET is in the active state is input to one input terminal of the comparator 44. Thus, the output of the comparator 44 arranged in each column AD converting section 41 is distributed according to the variation of threshold voltage of each amplifying transistor 5.

Further, since the output distribution is spread centering on the average value of the outputs of the source followers, it is possible to spread the reset level distribution without the occurrence of the shift of the average value of the reset level described above. In other words, since the vertical signal lines 21 are short-circuited by the switching transistor 111, a noise is added to the pixel signal transmitted via the vertical signal line 21.

Figure 11:
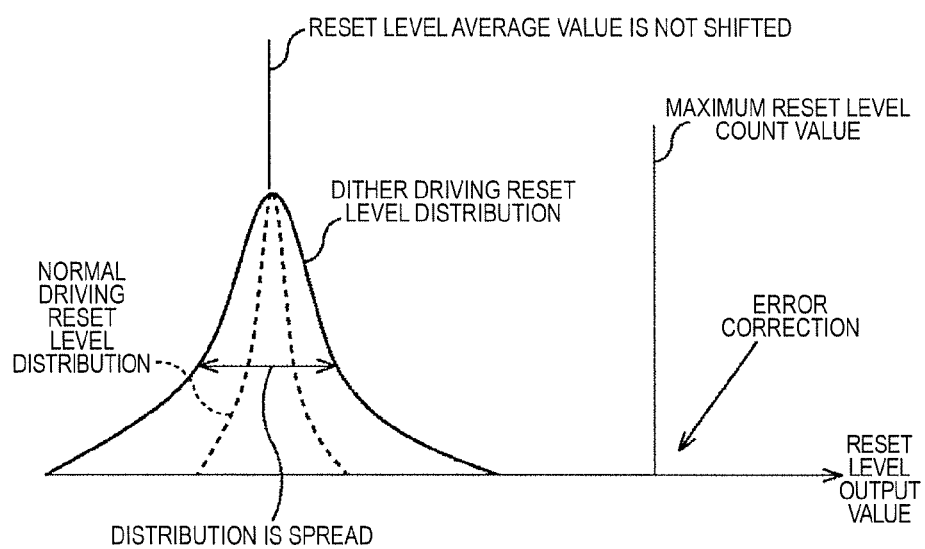
FIG. 11 is a diagram schematically illustrating a reset level distribution when a reset level average value is shifted.

FIG. 11 is a diagram schematically illustrating the reset level distribution when the shift of the average value of the reset level does not occur.

In the dither driving of FIG. 11, similarly to the dither driving of FIG. 7, the reset level distribution is spread, but since the reset level distribution is spread centering on the average value of the outputs of the source followers, the average value of the reset level is not shifted compared to the case of the normal driving. Thus, the reset level output value does not exceed the maximum reset level count value, and the counter 45 can perform accurate counting. As a result, the AD conversion is appropriately performed, and the distribution is spread. Thus, concentration of energy is mitigated, and it is possible to suppress deterioration of linearity caused by power fluctuation and a quantization vertical streak caused by a quantization error with a high degree of accuracy.

The reset level distribution is flared using the characteristics of the capacitive element 42 for signal coupling. FIGS. 12 and 13 illustrate specific examples of the DC cut in the capacitive elements 42-1 and 42-2 (FIG. 9) in the auto zero period of time (the AZ period of time) and the reset level period of time and the reset level distribution at that point in time.

A of FIG. 12 illustrates a voltage value of the DC cut in the case of the normal driving and the reset level distribution at that point in time for a comparison with B of FIG. 12. In this case, since the outputs of the source followers of the respective columns are not averaged, input voltages of the capacitive elements 42-1 and 42-2 in the auto zero period of time are 1.0 V and 2.0 V, and output voltages become 1.8 V through the DC cut.

Thereafter, in the reset level period of time, the input voltages of the capacitive elements 42-1 and 42-2 are 1.0 V and 2.0 V, respectively, and output voltages become 1.8 V through the DC cut. Further, in the normal driving, the reset level distribution in the reset level period of time is hardly spread, similarly to the auto zero period of time, and does not flare.

B of FIG. 12 illustrates the voltage value of the DC cut when driving is performed according to the driving timing illustrated in FIG. 10 and the reset level distribution at that point in time. In this case, the switching transistor 111 enters the on state, and the outputs of the source followers of the respective columns are averaged, and thus the input voltages of the capacitive elements 42-1 and 42-2 in the auto zero period of time become 1.5 V. Then, the DC cut is performed through the capacitive elements 42-1 and 42-2, and thus both of the output voltages become 1.8 V.

Thereafter, the switching transistor 111 enters the off state, and the vertical signal lines 21-1 and 21-2 are returned to the original state, and thus the input voltages of the capacitive elements 42-1 and 42-2 in the reset level period of time become 1.0 V and 2.0 V, respectively. Then, when the DC cut is performed through the capacitive elements 42-1 and 42-2, the output voltages become 1.3 V and 2.3 V according to the characteristics of the capacitive elements 42.

Then, as illustrated in B of FIG. 12, in the auto zero period of time, the input voltages become 1.5 which is the average value of the outputs of the source followers, and in the subsequent reset level period of time, when 1.0 V and 2.0 V are input as the input voltage, the output voltages are varied to 1.3 V and 2.3 V, and thus the reset level distribution in the reset level period of time has the increased width.

As described above, in the driving of B of FIG. 12 according to the present technology, the width of the reset level distribution can be increased to be larger than that in the normal driving of A of FIG. 12.

Next, a specific example of FIG. 13 will be described. A of FIG. 13 is illustrated for a comparison with B of FIG. 13 and is the same as A of FIG. 12, and thus a description thereof is omitted.

B of FIG. 13 illustrates the voltage value of the DC cut when driving is performed according to the driving timing illustrated in FIG. 10 and the reset level distribution at that point in time. In B of FIG. 13, the switching transistor 111 enters the on state, but enters the off state before the outputs of the source followers of the respective columns are completely averaged, and thus in the auto zero period of time, the input voltages of the capacitive elements 42-1 and 42-2 do not become one value but become 1.2 V and 1.8 V. Then, the DC cut is performed through the capacitive elements 42-1 and 42-2, and thus both of the output voltages become 1.8 V.

Thereafter, in the reset level period of time, the input voltages of the capacitive elements 42-1 and 42-2 become 1.0 V and 2.0 V, respectively. Then, when the DC cut is performed through the capacitive elements 42-1 and 42-2, the output voltages become 1.6 V and 2.0 V, respectively.

Then, as illustrated in B of FIG. 13, in the auto zero period of time, the input voltages get closer to the average value (for example, 1.5 V) of the outputs of the source followers such as 1.2 V and 1.8 V, and in the subsequent reset level period of time, when 1.0 V and 2.0 V are input as the input voltages, the output voltages are varied to 1.6 V and 2.0 V, and thus the reset level distribution in the reset level period of time has the increased width.

The reset level distribution in the reset level period of time of B of FIG. 13 has the width smaller than the reset level distribution in the reset level period of time of B of FIG. 12 since the input voltages are not completely averaged, but as the distribution is widened, the noise can be injected accordingly.

As described above, in the driving of B of FIG. 13 according to the present technology, the reset level distribution has the larger width than in the normal driving of A of FIG. 13.

<Driving According to Present Technology>

Next, the driving according to the present technology will be described in further detail. Here, in order to facilitate understanding of the present technology and clarify the background thereof, the normal driving will be described with reference to FIGS. 14 and 15, and then the driving according to the present technology will be described.

(Normal Driving)

Figure 14:
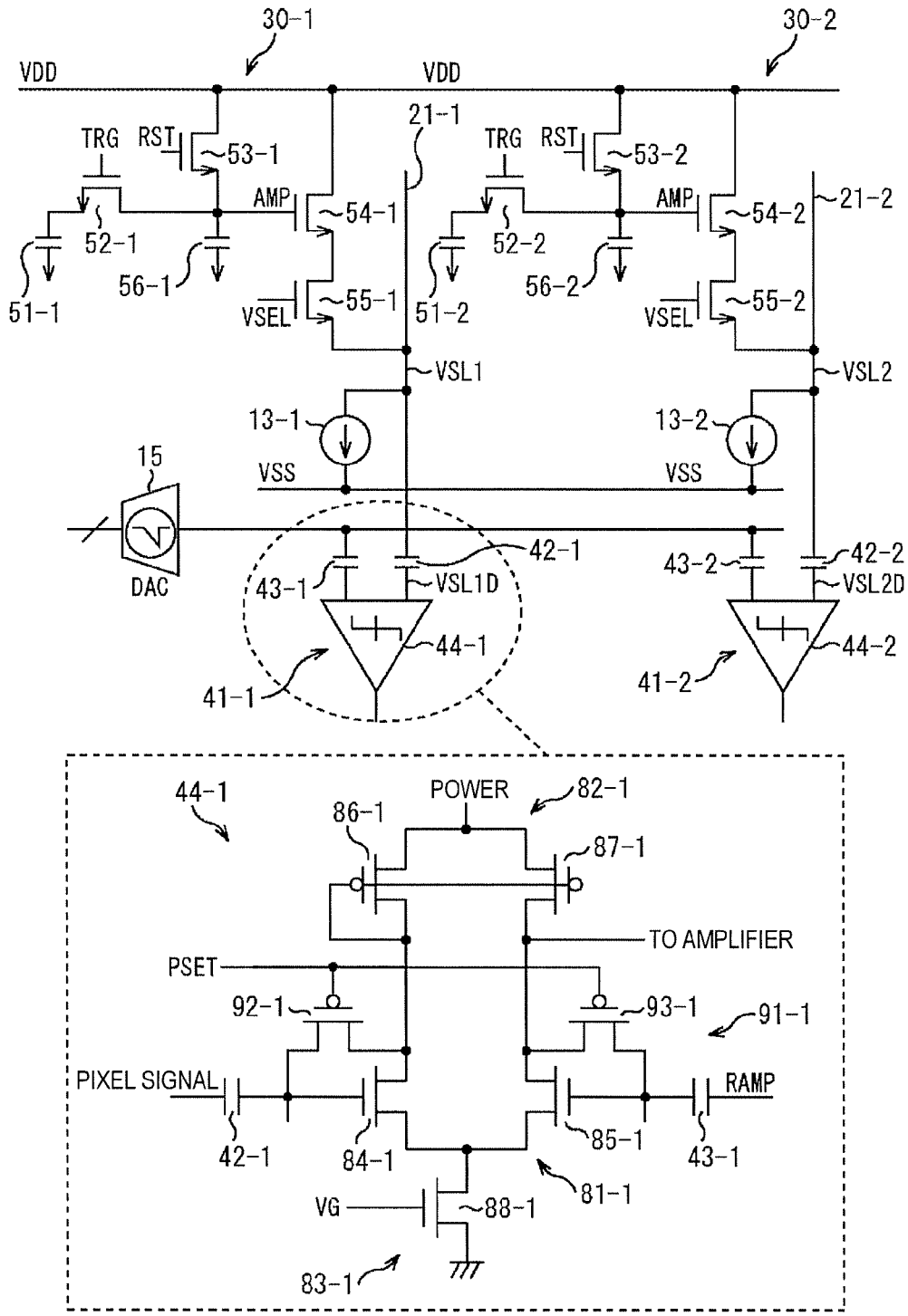
FIG. 14 is a diagram illustrating a circuit for normal driving.

FIG. 14 is a diagram illustrating a driving circuit used in the normal driving.

As illustrated in FIG. 14, in the normal driving, since the outputs of the source followers of the respective columns are not averaged, the row signal line 112 is not connected to the vertical signal lines 21-1 and 21-2, and the switching transistor 111 is not disposed. Thus, the normal driving is performed as illustrated in a timing chart of FIG. 15.

In other words, at a time t11, when the comparator reset pulse PSET is turned on at the same time at which the pixel reset pulse RST is turned on, the voltage values of the outputs VSL1 and VSL2 of the source followers start to increase, and continuously increase until the pixel reset pulse RST is turned off at a time t12. Further, when a time t12 has elapsed, in the auto zero period of time, the voltage values of the outputs VSL1 and VSL2 of the source followers decrease and become 2.0 V and 1.0 V, respectively.

Thereafter, in the reset level period of time from a time t13 to a time t14, the ON period of time of the driving pulse TRG from the time t14 to a time t15, and the signal level period of time after the time t15, the outputs VSL1 and VSL2 become constant voltage values of 2.0 V and 1.0 V, respectively.

Further, since the outputs VSL1D and VSL2D of the capacitive elements 42 are DC-cut through the capacitive elements 42 as described above with reference to A of FIG. 12 and A of FIG. 13, the outputs VSL1D and VSL2D of the capacitive elements 42 become 1.8 V serving as the voltage value after the DC cut in all the periods of time.

The normal driving has been described above.

(Driving According to Present Technology)

Figure 16:
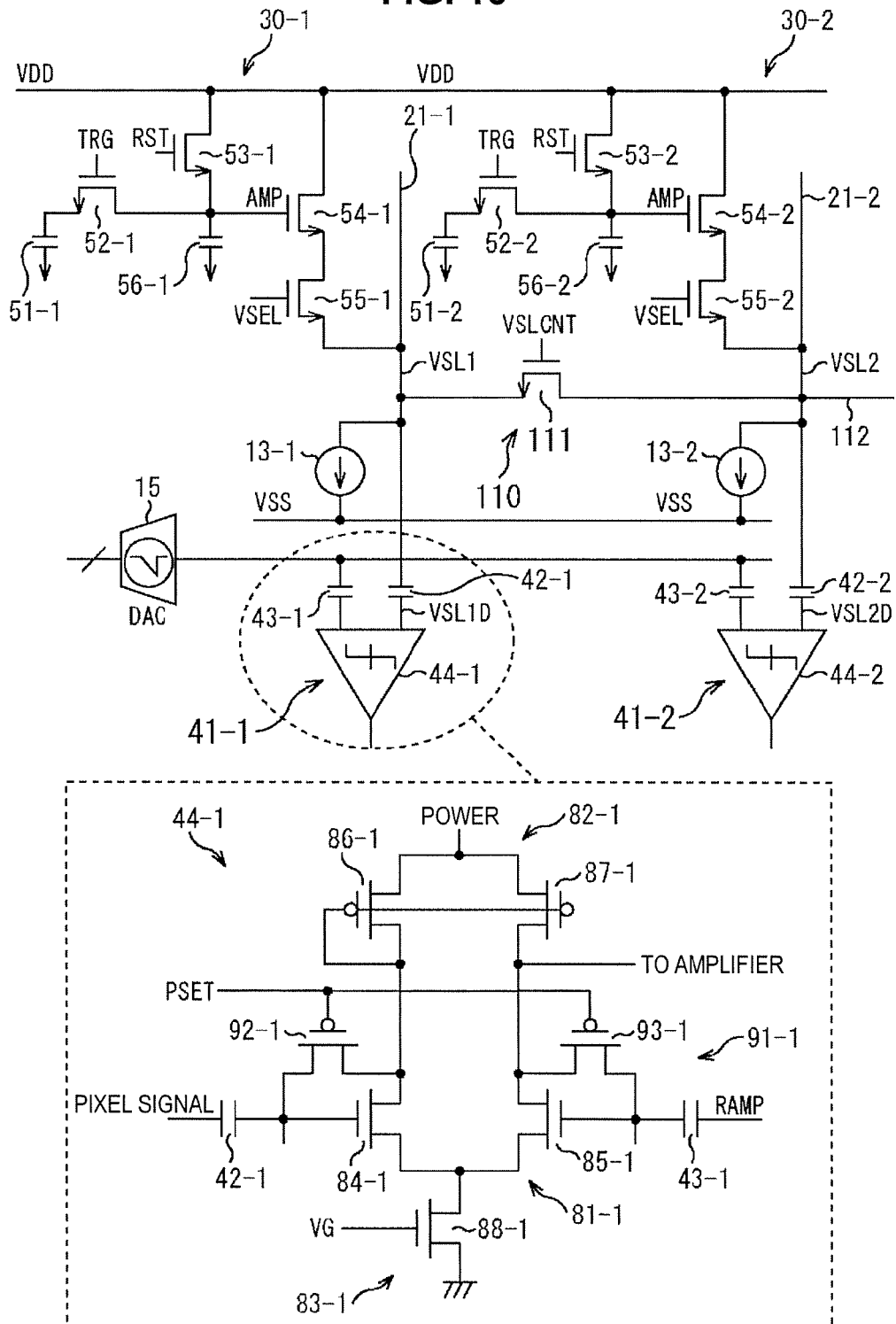
FIG. 16 is a diagram illustrating a circuit for driving according to the present technology.

FIG. 16 is a diagram illustrating a driving circuit used in the driving according to the present technology.

As illustrated in FIG. 16, in the driving according to the present technology, since the outputs of the source followers of the respective columns are averaged, the row signal line 112 is connected to the vertical signal lines 21-1 and 21-2, and the switching transistor 111 is further disposed. Thus, the driving according to the present technology is performed as illustrated in a timing chart of FIG. 17 or FIG. 18.

Figure 17:
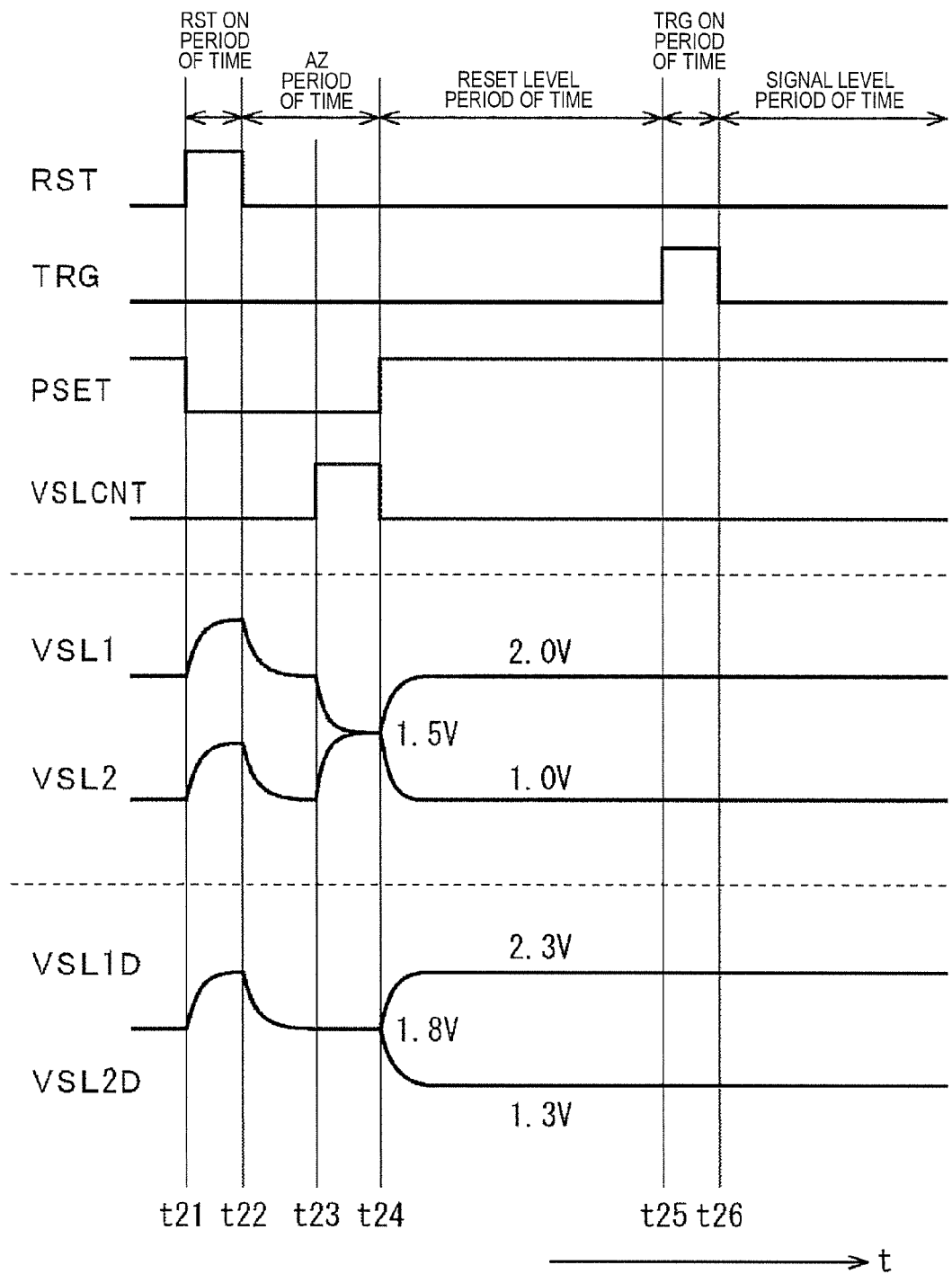
FIG. 17 is a timing chart for describing driving according to the present technology.

As illustrated in FIG. 17, at a time t21, when the comparator reset pulse PSET is turned on at the same time at which the pixel reset pulse RST is turned on, the voltage values of the outputs VSL1 and VSL2 of the source followers start to increase, and continuously increase until the pixel reset pulse RST is turned off at a time t22. Similarly, the voltage values of the outputs VSL1D and VSL2D of the capacitive elements 42 continuously increase from the time t21 to the time t22.

Further, when the time t22 has elapsed, in the auto zero period of time, the voltage values of the outputs VSL1 and VSL2 of the source followers decrease. Then, when the control pulse VSLCNT is turned on at a time t23, the vertical signal lines 21 are short-circuited through the switching transistor 111, and the outputs of the source followers of the respective columns are averaged. As a result, at a time t24, the outputs VSL1 and VSL2 become an average value, that is 1.5 V. In other words, the vertical signal lines 21 are short-circuited through cross coupling, and thus the outputs of the source followers are averaged.

Further, since the outputs VSL1D and VSL2D of the capacitive elements 42 are DC-cut through the capacitive elements 42 as described above with reference to B of FIG. 12, at the time t24, the outputs VSL1D and VSL2D become 1.8 V serving as the voltage value after the DC cut.

Thereafter, after the time t24, the control pulse VSLCNT is turned off, the vertical signal lines 21 are returned to the original state before they were short-circuited, and thus in the reset level period of time, the voltage values of the outputs VSL1 and VSL2 of the source followers become 2.0 V and 1.0 V, respectively. Then, in the ON period of time of the driving pulse TRG from a time t25 to a time t26 and the signal level period of time after the time t26, the outputs VSL1 and VSL2 become constant voltage values of 2.0 V and 1.0 V, respectively.

Further, when the outputs VSL1D and VSL2D of the capacitive elements 42 are DC-cut through the capacitive elements 42 as described above with reference to B of FIG. 12, the outputs VSL1D and VSL2D become 2.3 V and 1.3 V according to characteristics thereof. In other words, when the control pulse VSLCNT is turned off, the outputs of the source followers move, and thus the nodes after the DC cut follow the outputs of the source followers, and the reset level distribution is spread. As a result, the noise is added to the pixel signal transmitted via the vertical signal line 21.

Figure 18:
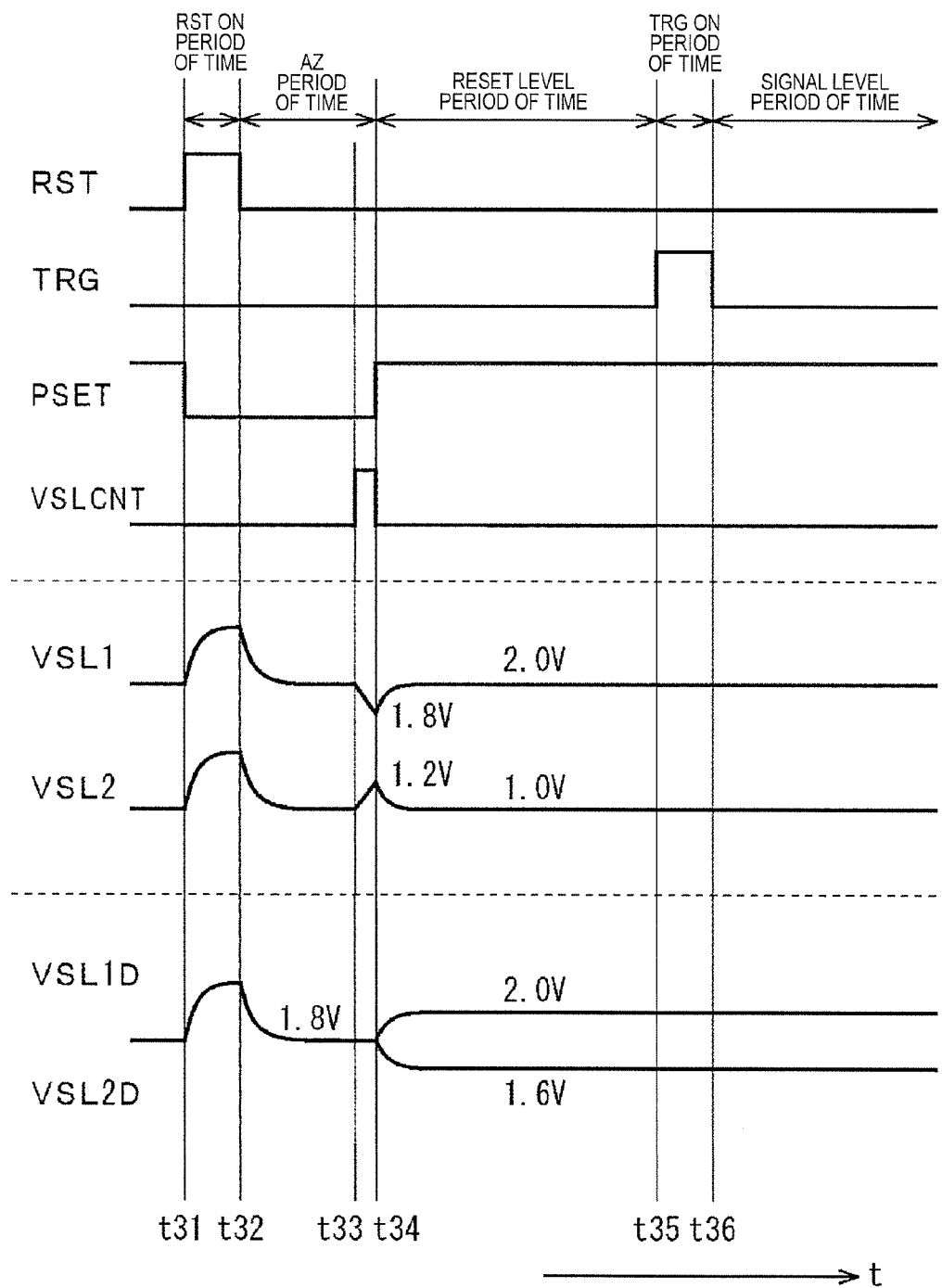
FIG. 18 is a timing chart for describing driving according to the present technology.

Further, as described above, when the switching transistor 111 enters the on state, although the switching transistor 111 enters the on state before the outputs of the source followers of the respective columns are completely averaged, it is possible to spread the reset level distribution and add the noise. For example, as illustrated in FIG. 18, when the control pulse VSLCNT is turned on at a time t33, but at a time t34 that is temporally earlier than a timing at which the outputs of the source followers of the respective columns are completely averaged, the control pulse VSLCNT is turned on, and thus the outputs VSL1 and VSL2 become 1.8 V and 1.2 V, respectively.

Thereafter, after the time t34, the control pulse VSLCNT is turned on, and the vertical signal lines 21 are returned to the original state before they were short-circuited, and thus in the reset level period of time, the voltage values of the outputs VSL1 and VSL2 of the source followers become 2.0 V and 1.0 V, respectively. Further, in the ON period of time of the driving pulse TRG from a time t35 to a time t36 and the signal level period of time after the time t36, the outputs VSL1 and VSL2 become constant voltage values of 2.0 V and 1.0 V, respectively.

In other words, as the vertical signal lines 21 are cross-coupled, the outputs VSL1 and VSL2 are averaged, but even when the pulse width of the control pulse VSLCNT is reduced, and the cross-coupling is disconnected in the middle, it is possible to inject the noise according to a change in the outputs of the source followers.

Further, because the outputs VSL1D and VSL2D of the capacitive elements 42 are DC-cut through the capacitive elements 42 as described above with reference to B of FIG. 13, at the time t34, the outputs VSL1D and VSL2D become 1.8 V serving as the voltage value after the DC cut. Thereafter, after the time t34, the outputs VSL1D and VSL2D become 2.0 V and 1.6 V according to the characteristics of the capacitive element 42.

In other words, this is not the case in which, when the control pulse VSLCNT is turned off, the outputs of the source followers move, and thus the nodes after the DC cut follow the outputs of the source followers, and the outputs of the source followers are completely averaged, but the reset level distribution is spread. In other words, it is possible to adjust the width of the reset level distribution according to the pulse width of the control pulse VSLCNT.

Figure 15:
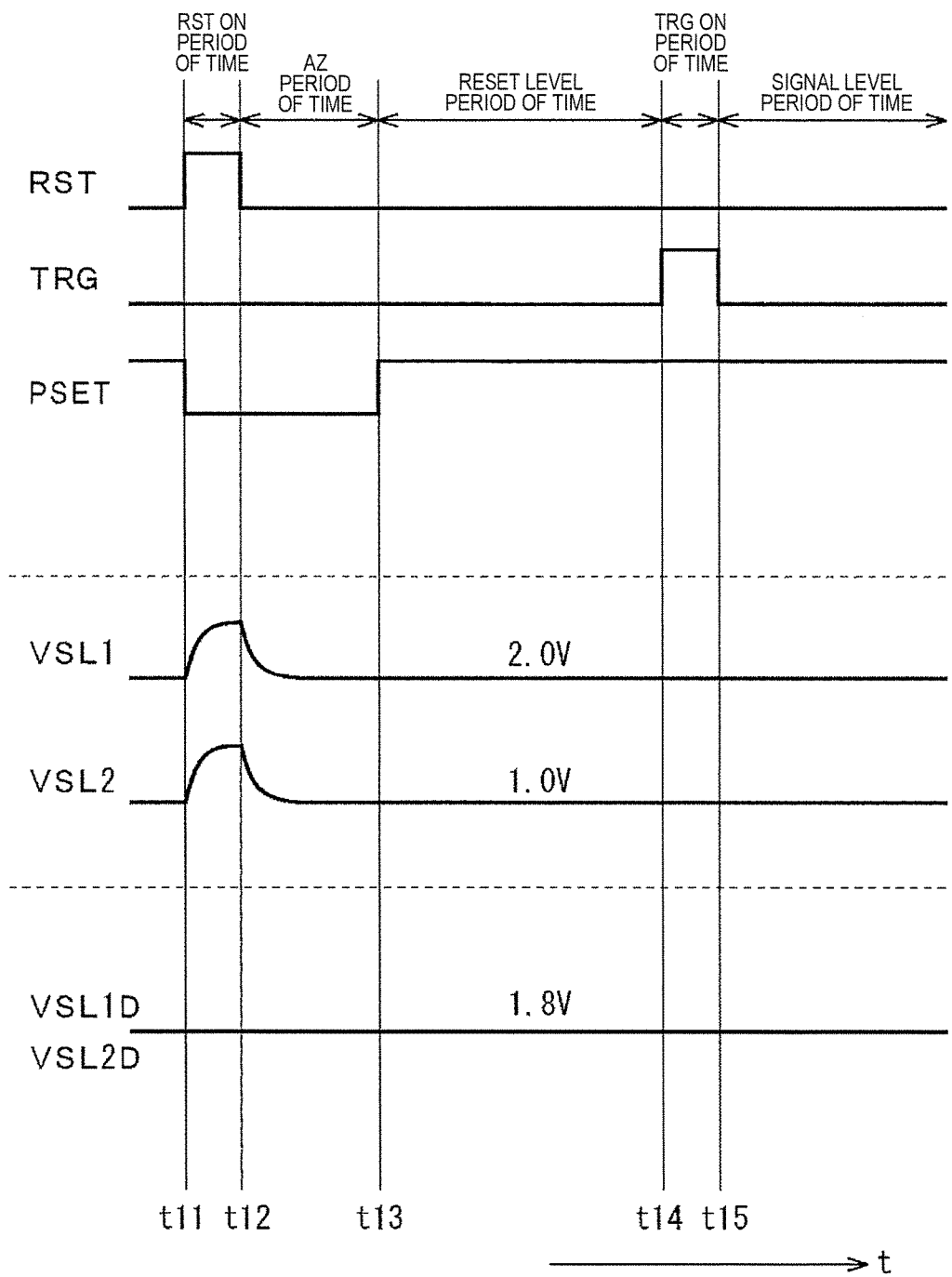
FIG. 15 is a timing chart for describing normal driving.

As described above, in the driving of FIGS. 17 and 18 according to the present technology, it is possible to increase the width of the reset level distribution to be larger than that in the normal driving of FIG. 15.

Further, for the sake of simplicity of description, the timing charts of FIGS. 15, 17, and 18 are based on an example in which a black signal in which light is not incident on the photodiode 51 is read. In other words, when light is incident, if the driving pulse TRG is turned on, the charges accumulated in the photodiode 51 are transferred to the floating diffusion 56, so that the signal level is read, and the values of the outputs VSL1 and VSL2 of the source followers are changed.

The driving according to the present technology has been described above.

According to the driving according to the present technology, when the noise is injected in order to suppress concentration of energy, a quantization vertical streak, and the like, the shift of the average value of the reset level does not occur, and the reset level distribution can be spread. As a result, since the AD conversion is appropriately performed, it is possible to suppress deterioration of linearity in AD conversion and a quantization vertical streak caused by a quantization error with a high degree of accuracy.

For example, as illustrated in A of FIG. 19, in the case of the normal driving, a quantization error is accumulated in the result obtained by performing the differential process between the AD conversion result of the reset level and the AD conversion result of the signal level each time, and a vertical streak-like noise caused by the quantization error is found in an image obtained as a result.

On the other hand, in the case of the driving according to the present technology, since the noise is injected, a quantization error is generated irregularly for each pixel, and the quantization error is not accumulated for each column. Thus, since the image obtained by performing the differential process is an image in which the quantization error is interposed similarly to A of FIG. 19, the quantization errors are irregularly distributed, and thus a vertical streak form is not recognized at all as illustrated in B of FIG. 19.

As described above, it is possible to reduce the vertical streak noise caused by the quantization noise after the differential process only by injecting the noise into the reset level serving as the reference of the differential process. In A of FIG. 19 and B of FIG. 19, the amount of noise remaining even after the differential process does not change, but when the noise is accumulated for each column and recognized as the vertical streak noise, human perception is significantly different from when the noise is irregularly distributed, and when the noise is irregularly distributed, it is more naturally accepted. It is due to humans' cognitive psychological characteristics that consciousness concentrates on a geometric pattern when geometric pattern recognition is possible.

Further, in the shift of the average value of the reset level, performing an offset adjustment may be considered, but in order to implement this, an offset gain linkage or automatic adjustment function is necessary, and thus the circuit size is increased. In the present technology, since it is possible to suppress the shift of the average value of the reset level only by installing the switching transistor 111, the circuit size is not increased.

Further, in the present technology, the vertical signal lines 21 are short-circuited, so that the noise is added to the pixel signal transmitted via the vertical signal line 21, but as illustrated in FIG. 8, a noise that is temporally unchanging but is irregular in a two-dimensional space may be added through the noise adding section 19.

Another Embodiment (Driving for Each Pixel of Same Color)

Meanwhile, in the CMOS image sensor 101 of FIG. 8, the unit pixels 30 arranged in the pixel array section 11 correspond to color imaging. In other words, in a plurality of unit pixels 30 that are arranged in the pixel array section 11 in the matrix form, any one color filter of a color separation filter including a combination of color filters of a plurality of colors for imaging a color image is disposed on a light reception plane of each photodiode 51 on which light is incident.

Figure 20:
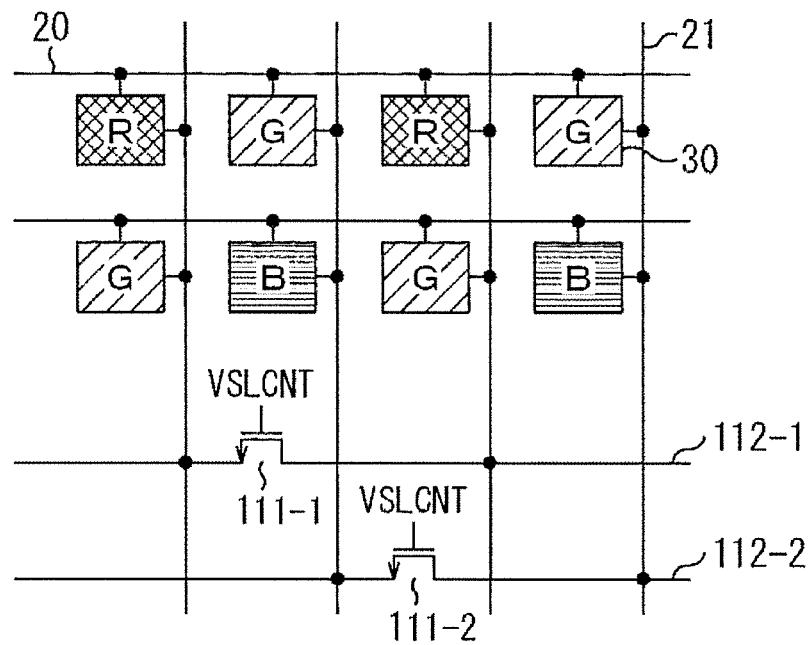
FIG. 20 is a diagram for describing driving performed in units of pixels of the same color.

In the example illustrated in FIG. 20, a color filter of a basic form of a so-called Bayer array (a Bayer arrangement) is used, and the pixel array section 11 is configured such that the unit pixels 30 two-dimensionally arranged in the matrix form correspond to three color filters of red (R), green (G), and blue (B), and repetitive units of the color separation filter are arranged in the form of 2×2 pixels.

For example, a first color pixel for detecting a first color (for example, R) is arranged at a position of an odd-numbered row and an odd-numbered column, a second color pixel for detecting a second color (for example, G) is arranged at a position of an odd-numbered row and an even-numbered column and a position of an even-numbered row and an odd-numbered column, and a third color pixel for detecting a third color (for example, B) is arranged at a position of an even-numbered row and an even-numbered column. In other words, colors pixels of two colors of R/G or G/B differing according to each row are arranged in a checkerboard pattern form.

In the color array of the color filters of the basic form of the Bayer array, two colors of R/G or G/B are repeated two by two in both the row direction and the column direction, but a configuration in which the switching transistor 111 is disposed for each color of a color pixel, the vertical signal lines 21 are connected by the row signal line 112 for each color, and the outputs of the source followers of the same color are combined may be provided.

For example, in FIG. 20, the vertical signal lines 21 of the even-numbered columns to which color pixels of the even-numbered column (R or G) are connected are connected by a row signal line 112-1, and the outputs of the source followers thereof are connected. Similarly, the vertical signal lines 21 of the odd-numbered columns to which color pixels of the odd-numbered column (G or B) are connected are connected by a row signal line 112-2, and the outputs of the source followers thereof are connected.

A switching transistor 111-1 in which the control pulse VSLCNT is input to a gate thereof is disposed in the row signal line 112-1 connecting the vertical signal lines 21 of the even-numbered columns for each color. Further, a switching transistor 111-1 in which the control pulse VSLCNT is input to a gate thereof is disposed in the row signal line 112-2 connecting the vertical signal lines 21 of the odd-numbered columns for each color.

Further, as the switching transistors 111-1 and 112-2 perform a switching operation according to the control pulse VSLCNT, the vertical signal lines 21 of the even-numbered columns or the odd-numbered columns can be short-circuited, and the outputs of the source followers can be averaged for each color.

Here, it is commonly known that neighboring color pixels of the same color output signals of the same level, and color pixels of different colors output signals of different levels. In other words, since the outputs of the source followers of the same color are signals of the same level, it is possible to spread the distribution using the average value of the reset level of each color by causing the connected vertical signal lines 21 of the same color to be short-circuited, and thus it is possible to prevent concentration of energy with a high degree of accuracy.

(Linkage of AD Conversion Gain and Control Pulse VSLCNT)

In the CMOS image sensor 101 of FIG. 8, the AD conversion gain is adjusted by changing the inclination of the slope of the reference signal RAMP generated by the reference signal generating section 15. Specifically, as the inclination of the reference signal RAMP is gentler, a point in time at which the reference signal RAMP matches the pixel signal transmitted via the vertical signal line 21 is delayed more, and thus a large digital signal is obtained, and the AD conversion gain is increased. Adversely, when the inclination of the reference signal RAMP is steeper, the AD conversion gain is decreased.

In other words, a point in time at which the reference signal RAMP matches the pixel signal transmitted via the vertical signal line 21 is adjusted by changing the inclination of the reference signal RAMP. As a result, even when the signal voltages of the pixel signals transmitted via the vertical signal lines 21 are the same, a count value at a matching point in time, that is, the digital signal of the signal voltage, is adjusted. This means that the changing of the inclination of the reference signal RAMP is equivalent to the adjusting of the AD conversion gain.

Here, for example, when the inclination of the reference signal RAMP is halved, and the AD conversion gain is doubled, the inclination when the reset level is acquired becomes ½, and thus when the distribution is the same as before the inclination was halved, it deviates from the range of the reference signal RAMP, and it is difficult to acquire the reset level.

Thus, when the AD conversion gain is set to be high, it is necessary to narrow the reset level distribution, and when the AD conversion gain is set to be low, it is necessary to widen the reset level distribution, but since it is possible to adjust the width of the reset level distribution according to the pulse width of the control pulse VSLCNT as described above, this can be used herein.

Figure 21:
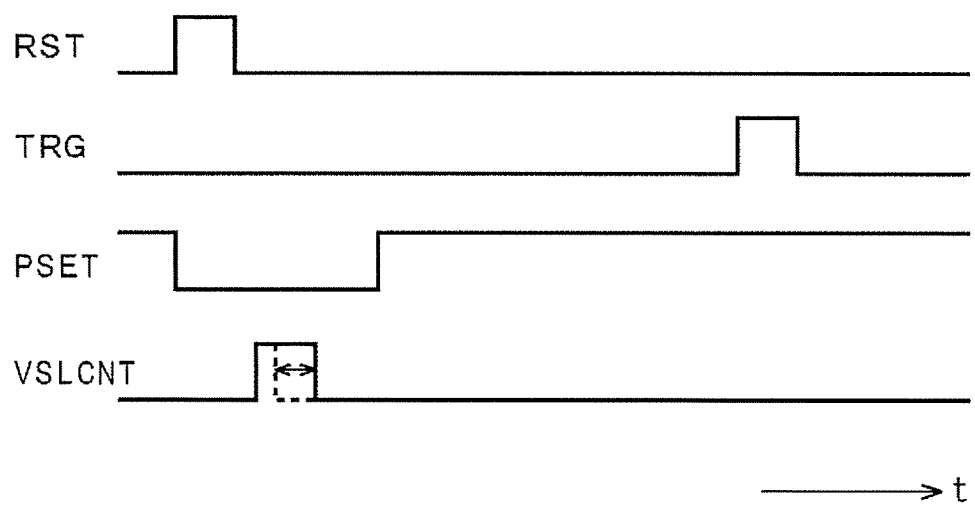
FIG. 21 is a diagram for describing driving in which an AD conversion gain is in conjunction with a control pulse VSLCNT.

In other words, as illustrated in FIG. 21, the control pulse VSLCNT is at the H level only during a certain period of time in the period of time (the auto zero period of time) in which the comparator reset pulse PSET on the comparator 44 is the active state, but the period of time of the H level is adjusted according to the AD conversion gain. Specifically, when the AD conversion gain is set to be high, the pulse width of the control pulse VSLCNT is reduced so that the reset level distribution is not widened. On the other hand, when the AD conversion gain is set to be low, the pulse width of the control pulse VSLCNT is increased so that the reset level distribution is widened.

As a result, for example, when the AD conversion gain is set to be low, if the pulse width of the control pulse VSLCNT is increased, the reset level distribution is widened, and the distribution thereof is spread, and thus it is possible to prevent concentration of energy with a high degree of accuracy.

(Linkage of AD Conversion Gain and Auto Zero Period of Time)

Further, it is possible to adjust the pulse width of the comparator reset pulse PSET in conjunction with the AD conversion gain.

Figure 22:
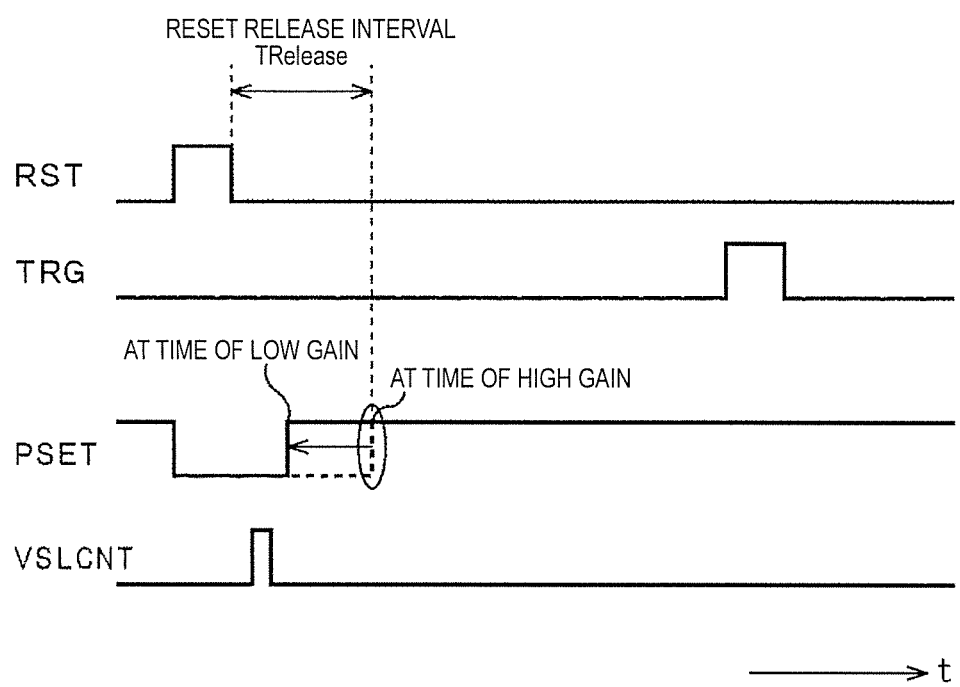
FIG. 22 is a diagram for describing driving in which an AD conversion gain is in conjunction with an auto-zero period of time.

For example, when the inclination of the reference signal RAMP is gentle and the AD conversion gain is low, in order to prevent the quantization error, the pulse width of the comparator reset pulse PSET is decreased so that the rising edge of the comparator reset pulse PSET gets closer to the rising edge of the pixel reset pulse RST as indicated by a solid line in FIG. 22. In other words, by decreasing the reset release interval TRelease, the comparator 44 is turned off by the comparator reset pulse PSET before the reset noise appearing on the vertical signal line 21 is stabilized, and thus the reset noise is actively injected.

On the other hand, when the inclination of the reference signal RAMP is steep and the AD conversion gain is high, a priority is given to stabilization of the AD conversion, and the pulse width of the comparator reset pulse PSET is widened as indicated by a dotted line in FIG. 22. In other words, the reset release interval TRelease is increased to the same degree as the normal timing, and after the reset noise is stabilized, the comparator 44 is turned off by the comparator reset pulse PSET.

The two states are changed smoothly by controlling the pulse width of the comparator reset pulse PSET (the auto zero period of time) continuously according to the AD conversion gain or are changed stepwise by controlling the pulse width of the comparator reset pulse PSET (the auto zero period of time) stepwise according to the AD conversion gain. As a result, when the noise injection is performed, it is possible to adjust the reset release interval TRelease in conjunction with the AD conversion gain by shifting a timing at which the comparator reset pulse PSET is turned off to a previous timing by a degree suitable for the AD conversion gain.

(AD Conversion Gain of Each Color)

As illustrated in FIG. 20, in the CMOS image sensor 101 of FIG. 8, for example, the color filter of the basic form of the Bayer array is used, and the unit pixels 30 are arranged according to the Bayer array. Further, as described above, the color filters are repeated in units of two rows and two columns. Here, the pixel signal is read in units of rows, and the pixel signal is input to the column AD converting section 41 disposed in each vertical signal line 21 for each column, and thus the pixel signals of only two colors of either R/G or G/B are present in one processing target row.

Figure 23:
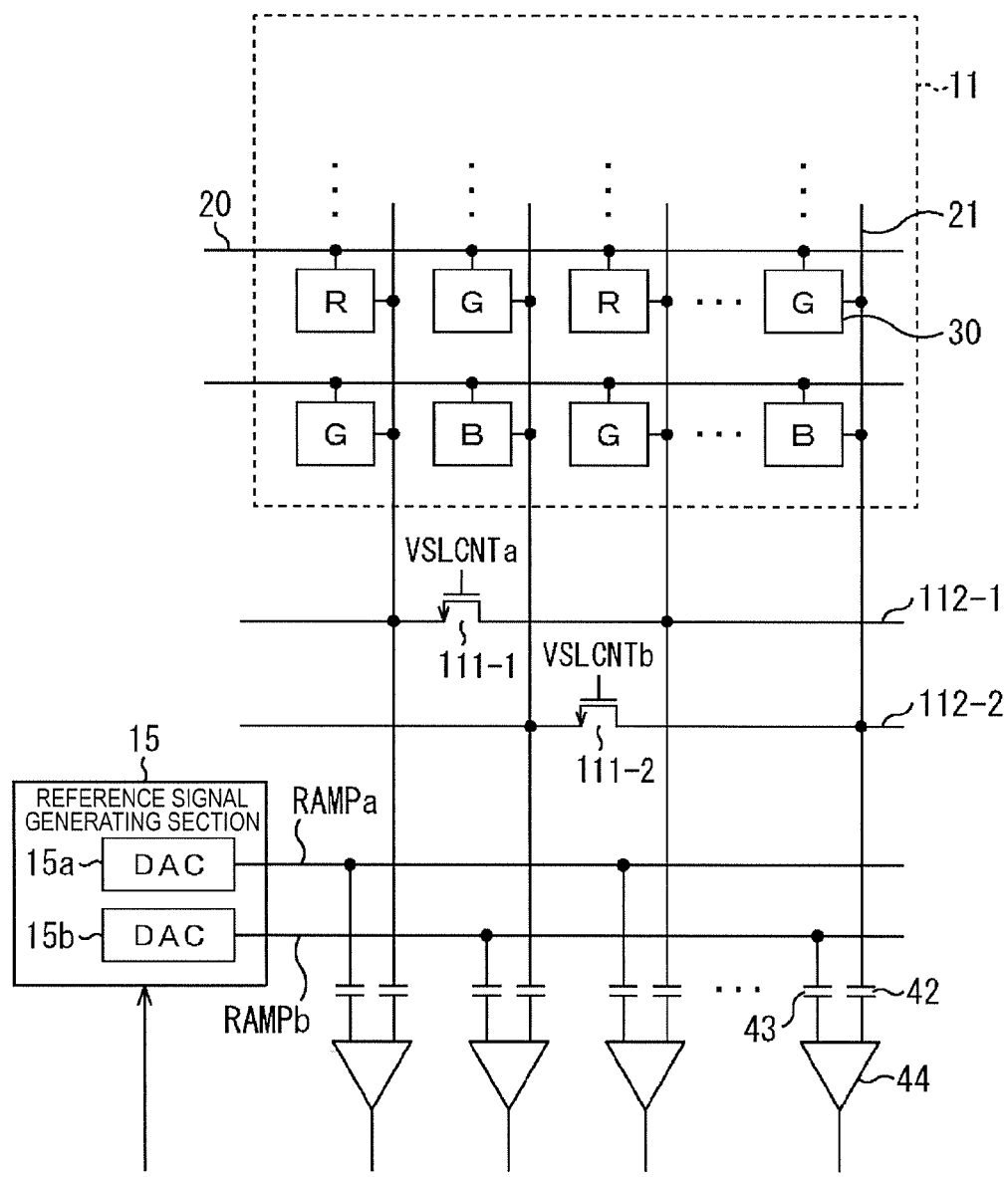
FIG. 23 is a diagram illustrating a configuration in which a reference signal of each color is generated.

Thus, the CMOS image sensor 101 can employ a configuration in which a DAC 15a corresponding to the even-numbered columns and a DAC 15b corresponding to the odd-numbered columns are disposed as illustrated in FIG. 23.

The DACs 15a and 15b generate a step-like saw-tooth wave (ramp waveform) based on the control signal from the communication timing control section 17. The DACs 15a and 15b supply the generated step-like saw-tooth waves to the column AD converting sections 41 of the column processing section 14 as reference signals RAMPa and RAMPb.

In other words, in the reference signal generating section 15, when the control signal for generating the reference signals RAMPa and RAMPb is supplied from the communication timing control section 17, the DAC 15a generates the reference signal RAMPa that has an inclination βa according to a color pixel characteristic of one color (R or G of the even-numbered column) present on the row control line 20 and has a step-like waveform that is temporally changed in a saw tooth form as a whole. Then, the DAC 15a supplies the generated reference signal RAMPa to the other input terminal of the comparator 44 of the column AD converting section 41 corresponding to the even-numbered column via the capacitive element 43.

Similarly, the DAC 15b generates the reference signal RAMPb that has an inclination βb according to a color pixel characteristic of one color (G or B of the odd-numbered column) present on the row control line 20 and has a step-like waveform that is temporally changed in a saw tooth form as a whole. Then, the DAC 15b supplies the generated reference signal RAMPb to the other input terminal of the comparator 44 of the column AD converting section 41 corresponding to the odd-numbered column via the capacitive element 43.

In other words, in the reference signal generating section 15, the DAC for generating the reference signal RAMP is not prepared for all colors of the color filters in the color separation filter, and the DAC is disposed in a number according to a combination of certain colors according to a repetition cycle of a color decided according to a type or an array of a color. Further, when a processing target row is switched, a combination of certain colors present in the processing target row is switched. Thus, in response to the switching, change characteristics (for example, the inclinations βa and βb) or initial values of the reference signals RAMPa and RAMPb generated by the DACs 15a and 15b are switched according to characteristics of the color filter, that is, characteristics of the pixel signal.

Since the reference signal RAMP is generated for each color as described above, the AD conversion gain is changed for each color as well. Further, the AD conversion gain is in conjunction with the control pulse VSLCNT or the like, but since a principle does not change at all even if the AD conversion gain is changed for each color, it is possible to cause the control pulse VSLCNT or the like to be in conjunction with the AD conversion gain of each color.

For example, as illustrated in FIG. 23, as the pulse width of the control pulse VSLCNT is adjusted according to the AD conversion gain for each color, a control pulse VSLCNTa is input to the gate of the switching transistor 111-1, and a control pulse VSLCNTb is input to the gate of the switching transistor 111-2. As a result, it is possible to control the switching transistors 111-1 and 111-2 individually, average, for example, the outputs of the source followers, or adjust the width of the reset level distribution.

Further, the applicant of the present application has already proposed the technique of switching the reference signal RAMP for each color in JP 2005-328135A (JP 4449565B).

(Another Connection Form of Switching Transistor)

Figure 24:
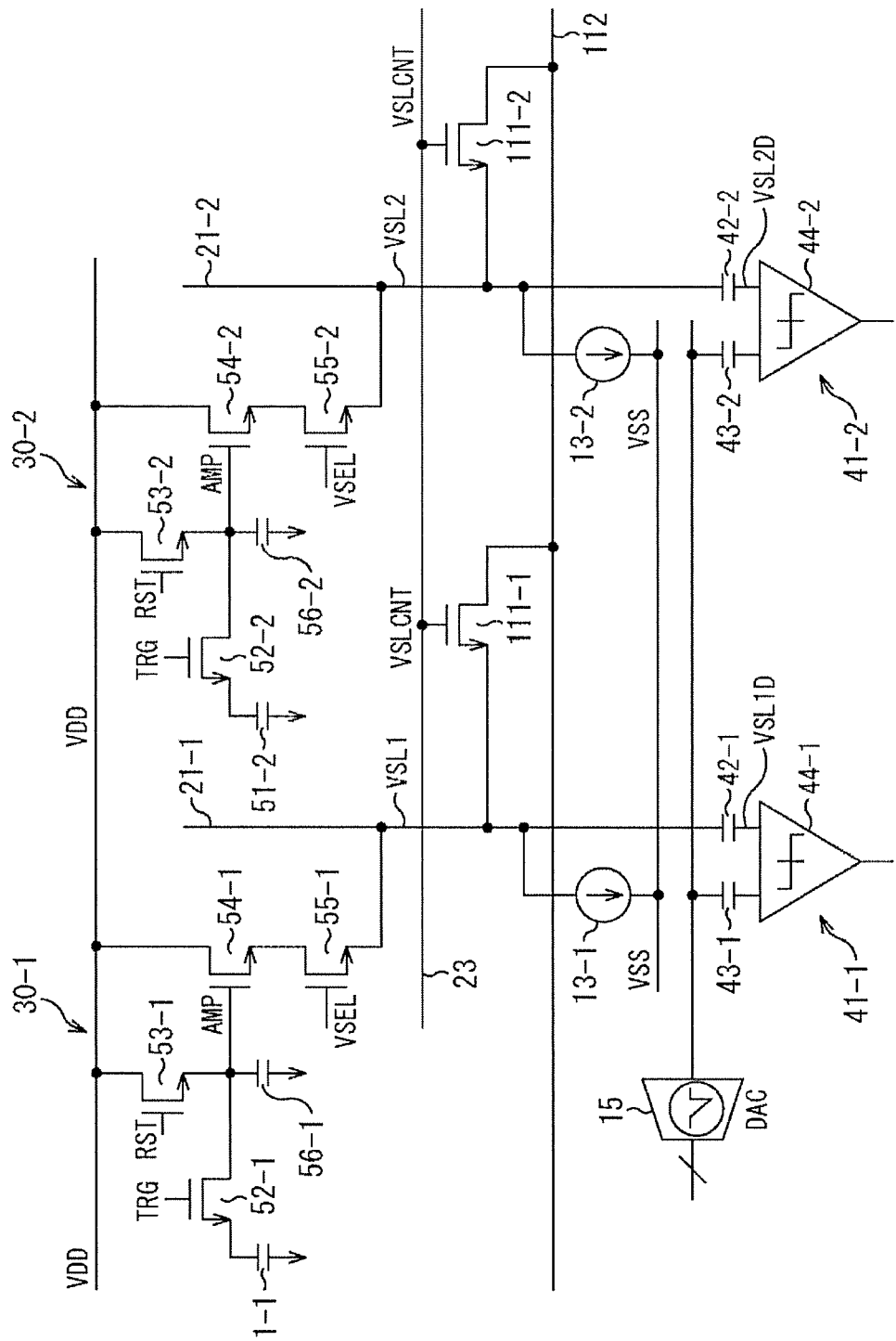
FIG. 24 is a diagram illustrating another example of a configuration and a connection form of a switch.

As the connection form of the switching transistor 111, a connection form other than the connection form illustrated in FIG. 9 may be employed. FIG. 24 illustrates another connection form of the switching transistor 111.

As illustrated in FIG. 24, in a switching transistor 111-1, a gate is connected with the communication timing control section 17 via the control line 23, a source is connected to the vertical signal line 21-1, and a drain is connected to the row signal line 112. Similarly, in a switching transistor 111-2, a gate is connected to the control line 23, a source is connected to the vertical signal line 21-2, and a drain is connected to the row signal line 112.

In this connection form, the switching transistors 111-1 and 111-2 perform the switching operation according to the control pulse VSLCNT input to the gates thereof, so that the vertical signal lines 21-1 and 21-2 can be short-circuited.

Further, the connection form of FIG. 24 is an example of another connection form of the switching transistor 111, but any other connection form may be employed. In short, it is preferable that the switching transistor 111 be able to cause the vertical signal lines 21 to be short-circuited through the switching operation, and the connection form between the vertical signal line 21 and the row signal line 112 is arbitrary.

Further, the switching transistor 111 may be connected with all the vertical signal lines 21 (H0, H1, . . . , Hh) or may be connected with some vertical signal lines 21 (for example, H0, H2, H4, . . . , and the like of the even-numbered columns) among all the vertical signal lines 21 (H0, H1, . . . , Hh). Further, when the switching transistor 111 is connected with some vertical signal lines 21, for example, the vertical signal lines 21 may be divided into blocks in a certain unit, and the switching transistor 111 may be connected with each of the blocks.

Further, the pixel array section 11 may employ a pixel sharing configuration in which a plurality of unit pixels 30 arranged in a matrix form share the amplifying transistor 54 and the vertical signal line 21 with other unit pixels.

Further, in this specification, "solid-state" in the solid-state imaging device means that it is manufactured using a semiconductor.

Note that application of the present technology is not limited to the application to the solid-state imaging device. That is, the present technology is applicable to a general electronic device using a solid-state imaging device for an imaging section (a photoelectric conversion section), the general electronic device including an imaging apparatus such as a digital still camera or a video camera, a mobile terminal device having an imaging function, a copier using a solid-state imaging device for an image reading section, and the like. The solid-state imaging device may be formed as one chip or may be formed as a module having an imaging function in which an imaging section and either a signal processing section or an optical system are packaged together.

<Configuration Example of Electronic Device to which Present Technology is Applied>

Figure 25:
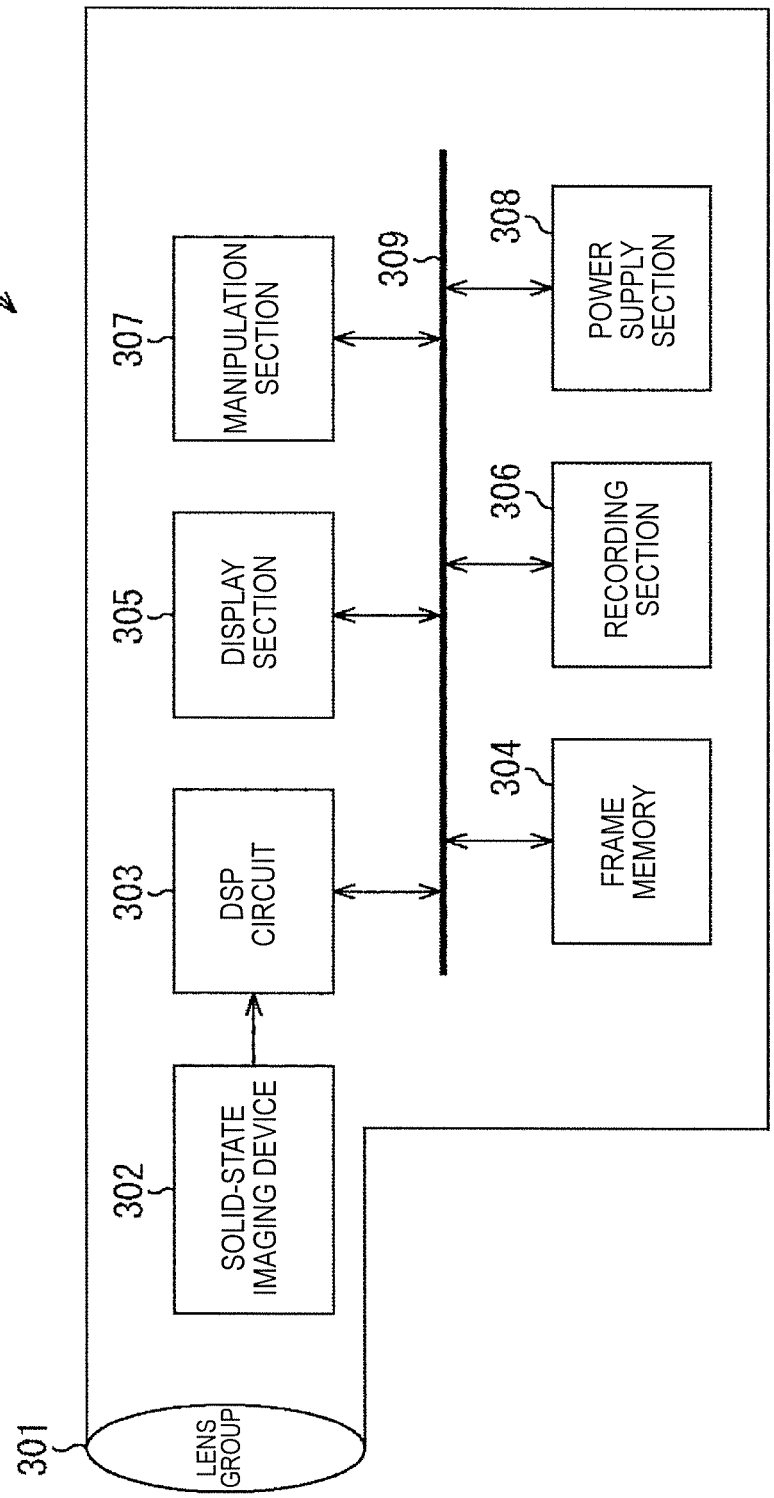
FIG. 25 is a diagram illustrating a configuration example of an imaging apparatus.

FIG. 25 is a block diagram of a configuration example of an imaging apparatus serving as an electronic device to which the present technology is applied.

An imaging apparatus 300 in FIG. 25 includes: an optical section 301 formed by a lens group or the like; a solid-state imaging device (an imaging device) 302 employing the aforementioned configuration of the unit pixels 30, and a DSP (Digital Signal Processor) circuit 303 which is a camera signal processing circuit. The imaging apparatus 300 also includes a frame memory 304, a display section 305, a recording section 306, a manipulation section 307, and a power supply section 308. The DSP circuit 303, the frame memory 304, the display section 305, the recording section 306, the manipulation section 307, and the power supply section 308 are connected to each other via a bus line 309.

The optical section 301 takes in incident light (image light) from a subject to form an image on an imaging surface of the solid-state imaging device 302. The solid-state imaging device 302 converts a light amount of incident light into an electrical signal on a pixel basis and outputs the electrical signal, the incident light being used for forming the image on the imaging surface by the optical section 301. It is possible to use, as the solid-state imaging device 302, a solid-state imaging device such as the CMOS image sensor 1 according to the aforementioned embodiment which is arranged on the CMOS image sensor, that is, a solid-state imaging device which makes it possible to capture an image without distortion by using global exposure.

The display section 305 includes a panel display device such as a liquid crystal panel or an organic EL (Electro Luminescence) panel, and displays a moving image or a still image captured by the solid-state imaging device 302. The recording section 306 records the moving image or the still image captured by the solid-state imaging device 302 in a recording medium.

The manipulation section 307 issues manipulation instructions for various functions of the imaging apparatus 300 in accordance with user's manipulation. The power supply section 308 appropriately supplies the DSP circuit 303, the frame memory 304, the display section 305, the recording section 306, and the manipulation section 307 with power to cause these sections to operate.

In addition, the aforementioned embodiment has been described by taking as an example the case where the present technology is applied to the CMOS image sensor including the unit pixels 30 arranged in a matrix form, the unit pixels each sensing, as a physical quantity, a signal charge corresponding to a light amount of visible light. The application of the present technology, however, is not limited to the application to the CMOS image sensor. The present technology is applicable to a general column-system solid-state imaging device including a column processing section arranged for each pixel column in a pixel array section.

The application of the present technology is not limited to the application to the solid-state imaging device which captures an image by sensing distribution of incident light amounts of visible light. The present technology is also applicable to: a solid-state imaging device which captures an image based on distribution of incidence amounts of infrared rays, X-rays, particles or the like; and a general solid-state imaging device in a broad sense (a physical-quantity distribution sensing device) such as a fingerprint detection sensor which captures an image by sensing distribution of other physical quantities such as pressures or electrostatic capacitances.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1)

A solid-state imaging device including:

a pixel section configured to include a plurality of pixels arranged in a matrix form, the plurality of pixels performing photoelectric conversion;

column signal lines configured to transmit pixel signals output from the pixels in units of columns;

an AD converting section configured to include a comparator that compares a reference signal serving as a ramp wave with the pixel signals transmitted via the column signal line and convert a reference level and a signal level of the pixel signals into digital signals independently based on a comparison result of the comparator;

a switch configured to be connected with the column signal lines; and a control section configured to turn on the switch only during a certain period of time in a period of time in which the comparator is reset and cause the column signal lines to be short-circuited.

(2)

The solid-state imaging device according to (1), wherein the plurality of pixels are arranged in the pixel section to correspond to a color filter in which colors are arranged in a certain repetitive unit, and wherein the switch is connected to each column signal line of pixels of the same color.

(3)

The solid-state imaging device according to (1) or (2), wherein the control section adjusts an ON period of time of the switch according to a gain of AD conversion performed by the AD converting section.

(4)

The solid-state imaging device according to any one of (1) to (3), wherein the control section adjusts a reset period of the comparator according to the gain of the AD conversion performed by the AD converting section.

(5)

The solid-state imaging device according to any one of (1) to (4), wherein the gain of the AD conversion performed by the AD converting section has a value corresponding to the reference signal differing according to each color.

(6)

The solid-state imaging device according to any one of (1) to (5), wherein the switch is a transistor, and wherein the transistor includes a gate connected to the control section via a control line and a source and a drain that are connected to a row signal line connected to the column signal line in a row direction.

(7)

The solid-state imaging device according to any one of (1) to (5), wherein the switch is a transistor, and wherein the transistor includes a gate connected to the control section via a control line, a source connected to the column signal line, and a drain connected to a row signal line in a row direction.

(8)

The solid-state imaging device according to any one of (1) to (7), wherein the switch is connected with all the column signal lines.

(9)

The solid-state imaging device according to any one of (1) to (7), wherein the column signal lines are divided into blocks in a certain unit, and wherein the switch is connected with the column signal lines in units of the blocks.

(10)

The solid-state imaging device according to any one of (1) to (9), wherein the plurality of pixels arranged in the pixel section in the matrix form share at least an amplifying transistor and the column signal lines with other pixels.

(11)

The solid-state imaging device according to any one of (1) to (10), further including:

a noise adding section configured to add a noise that is temporally unchanging and is irregular in a two-dimensional space to the pixel signals transmitted via the column signal lines.

(12)

A driving method of a solid-state imaging device, the solid-state imaging device including a pixel section configured to include a plurality of pixels arranged in a matrix form, the plurality of pixels performing photoelectric conversion, column signal lines configured to transmit pixel signals output from the pixels in units of columns, an AD converting section configured to include a comparator that compares a reference signal serving as a ramp wave with the pixel signals transmitted via the column signal line and convert a reference level and a signal level of the pixel signals into digital signals independently based on a comparison result of the comparator, and a switch configured to be connected with the column signal lines, the driving method including:

a step of, by the solid-state imaging device, turning on the switch only during a certain period of time in a period of time in which the comparator is reset and causing the column signal lines to be short-circuited.

(13)

An electronic device including:

a solid-state imaging device including a pixel section configured to include a plurality of pixels arranged in a matrix form, the plurality of pixels performing photoelectric conversion, column signal lines configured to transmit pixel signals output from the pixels in units of columns, an AD converting section configured to include a comparator that compares a reference signal serving as a ramp wave with the pixel signals transmitted via the column signal line and convert a reference level and a signal level of the pixel signals into digital signals independently based on a comparison result of the comparator, a switch configured to be connected with the column signal lines, and a control section configured to turn on the switch only during a certain period of time in a period of time in which the comparator is reset and cause the column signal lines to be short-circuited.

REFERENCE SIGNS LIST 1, 101 CMOS image sensor
11 pixel array section
13 read current source section
14 column processing section
15 reference signal generating section
15a, 15b DAC
17 communication timing control section
19 noise adding section
20 row control line
21 vertical signal line
23 control line
30 unit pixel
41 column AD converting section
42 capacitive element
43 capacitive element
44 comparator
45 counter
54 amplifying transistor
110 switch
111 switching transistor
112 row signal line
300 imaging apparatus
302 solid-state imaging device

The invention claimed is:

1. An imaging device comprising:
a plurality of pixels arranged in rows and columns, the plurality of pixels including a first pixel, a second pixel, a third pixel, a fourth pixel, a fifth pixel, a sixth pixel, a seventh pixel, and an eighth pixel, the first pixel and the second pixel coupled to an ith column signal line, the third pixel and the fourth pixel coupled to an i+1th column signal line, the fifth pixel and the sixth pixel coupled to an i+2th column signal line, and the seventh pixel and the eighth pixel coupled to an i+3th column signal line;
a first comparator coupled to the ith column signal line;
a second comparator coupled to the i+1th column signal line;
a third comparator coupled to the i+2th column signal line;
a fourth comparator coupled to the i+3th column signal line;
a first transistor, wherein a source or a drain of the first transistor is coupled to the ith column signal line, and the other of the source or the drain of the first transistor is coupled to the i+2th column signal line; and
a second transistor, wherein a source or a drain of the second transistor is coupled to the i+1th column signal line, and the other of the source or the drain of the second transistor is coupled to i+3th column signal line, and wherein
each of the first pixel and the fifth pixel has a red color filter, each of the second pixel, the third pixel, the sixth pixel and the seventh pixel has a green color filter, and each of the fourth pixel and the eighth pixel has a blue color filter.

2. The imaging device according to claim 1, wherein the first comparator includes a first differential transistor.

3. The imaging device according to claim 2, wherein the second comparator includes a second differential transistor.

4. The imaging device according to claim 3, wherein the third comparator includes a third differential transistor.

5. The imaging device according to claim 4, wherein the fourth comparator includes a fourth differential transistor.

6. The imaging device according to claim 4, wherein the first comparator includes a first reset transistor, one of a source or a drain of the first reset transistor is coupled to one of a drain or a source of the first differential transistor, and the other of the source or the drain of the first reset transistor coupled to the other of the source or drain of the first differential transistor.

7. The imaging device according to claim 6, wherein a gate of the first reset transistor is configured to receive a first control signal.

8. The imaging device according to claim 7, wherein a gate of the first transistor is configured to receive a second control signal.

9. The imaging device according to claim 8, wherein the first transistor is configured to be in an on-state while the first reset transistor is in an on-state.

10. The imaging device according to claim 9, wherein the third comparator includes a second reset transistor, one of a source or a drain of the second reset transistor is coupled to one of a drain or a source of the third differential transistor, and the other of the source or the drain of the second reset transistor coupled to the other of the source or the drain of the third differential transistor.

11. The imaging device according to claim 10, wherein a gate of the second reset transistor is configured to receive a third control signal.

12. The imaging device according to claim 11, wherein the first transistor is configured to be in an on-state while the second reset transistor is in an on-state.

13. The imaging device according to claim 1, further comprising a first reference signal generation circuit configured to output a first reference signal, and a second reference signal generation circuit configured to output a second reference signal.

14. The imaging device according to claim 13, wherein the first reference signal is different from the second reference signal.

15. The imaging device according to claim 14, wherein a second control signal is controlled by the first reference signal and the second reference signal.

16. An electronic apparatus, comprising:
an imaging device including:
a plurality of pixels arranged in rows and columns, the plurality of pixels including a first pixel, a second pixel, a third pixel, a fourth pixel, a fifth pixel, a sixth pixel, a seventh pixel, and an eighth pixel, the first pixel and the second pixel coupled to an ith column signal line, the third pixel and the fourth pixel coupled to an i+1th column signal line, the fifth pixel and the sixth pixel coupled to an i+2th column signal line, and the seventh pixel and the eighth pixel coupled to an i+3th column signal line;
a first comparator coupled to the ith column signal line;
a second comparator coupled to the i+1th column signal line;
a third comparator coupled to the i+2th column signal line;
a fourth comparator coupled to the i+3th column signal line;
a first transistor, wherein a source or a drain of the first transistor is coupled to the ith column signal line, and the other of the source or the drain of the first transistor is coupled to the i+2th column signal line; and
a second transistor, wherein a source or a drain of the second transistor is coupled to the i+1th column signal line, and the other of the source or the drain of the second transistor is coupled to i+3th column signal line, and wherein
each of the first pixel and the fifth pixel has a red color filter, each of the second pixel, the third pixel, the sixth pixel and the seventh pixel has a green color filter, and each of the fourth pixel and the eighth pixel has a blue color filter.

17. The electronic apparatus according to claim 16, wherein the first comparator includes a first differential transistor.

18. The electronic apparatus according to claim 17, wherein the second comparator includes a second differential transistor.

19. The electronic apparatus according to claim 18, wherein the third comparator includes a third differential transistor.

20. The electronic apparatus according to claim 19, wherein the fourth comparator includes a fourth differential transistor.

21. The electronic apparatus according to claim 19, wherein the first comparator includes a first reset transistor, one of a source or a drain of the first reset transistor is coupled to one of a drain or a source of the first differential transistor, and the other of the source or the drain of the first reset transistor coupled to the other of the source or drain of the first differential transistor.

22. The electronic apparatus according to claim 21, wherein a gate of the first reset transistor is configured to receive a first control signal.

23. The electronic apparatus according to claim 22, wherein a gate of the first transistor is configured to receive a second control signal.

24. The electronic apparatus according to claim 23, wherein the first transistor is configured to be in an on-state while the first reset transistor is in an on-state.

25. The electronic apparatus according to claim 24, wherein the third comparator includes a second reset transistor, one of a source or a drain of the second reset transistor is coupled to one of a drain or a source of the third differential transistor, and the other of the source or the drain of the second reset transistor coupled to the other of the source or the drain of the third differential transistor.

26. The electronic apparatus according to claim 25, wherein a gate of the second reset transistor is configured to receive a third control signal.

27. The electronic apparatus according to claim 26, wherein the first transistor is configured to be in an on-state while the second reset transistor is in an on-state.

28. The electronic apparatus according to claim 16, further comprising a first reference signal generation circuit configured to output a first reference signal, and a second reference signal generation circuit configured to output a second reference signal.

29. The electronic apparatus according to claim 28, wherein the first reference signal is different from the second reference signal.

30. The electronic apparatus according to claim 29, wherein a second control signal is controlled by the first reference signal and the second reference signal.

* * * * *